(12) United States Patent
Lesso et al.

(10) Patent No.: US 12,736,498 B2
(45) Date of Patent: Sep. 15, 2026

(54) CIRCUITRY FOR ANALYTE MEASUREMENT

(71) Applicant: Cirrus Logic International Semiconductor Ltd., Edinburgh (GB)

(72) Inventors: John P. Lesso, Edinburgh (GB); Toru Ido, Kanagawa (JP)

(73) Assignee: Cirrus Logic Inc., Austin, TX (US)

( * ) Notice: Subject to any disclaimer, the term of this patent is extended or adjusted under 35 U.S.C. 154(b) by 78 days.

(21) Appl. No.: 18/739,994

(22) Filed: Jun. 11, 2024

(65) Prior Publication Data

US 2025/0377332 A1 Dec. 11, 2025

Related U.S. Application Data

(63) Continuation-in-part of application No. 18/498,918, filed on Oct. 31, 2023, now Pat. No. 12,535,449, which is a continuation of application No. 17/463,796, filed on Sep. 1, 2021, now Pat. No. 11,846,600.

(51) Int. Cl.

| | |
|---|---|
| ***G01R 19/257*** | (2006.01) |
| ***G01N 27/30*** | (2006.01) |
| ***G01N 27/327*** | (2006.01) |
| ***G01N 27/416*** | (2006.01) |
| ***G01R 19/165*** | (2006.01) |

(52) U.S. Cl.

CPC ......... *G01N 27/416* (2013.01); *G01N 27/301* (2013.01); *G01R 19/16576* (2013.01)

(58) Field of Classification Search

CPC .. G01N 27/3273; G01N 27/416; G01N 27/30; G01N 33/4875; G01N 33/48785; G01N 33/4148; G01R 19/165; G01R 19/16566; H03K 7/08; H03K 3/00; H03K 3/02; H03K 3/023; H03L 7/10; H03L 7/099; H03L 7/18; H03L 7/085; H03L 7/087

See application file for complete search history.

(56) References Cited

U.S. PATENT DOCUMENTS

| | | | | |
|---|---|---|---|---|
| 6,366,794 | B1 | 4/2002 | Moussy et al. | |
| 10,756,745 | B2 | 8/2020 | Dastgheib et al. | |
| 11,846,600 | B2 * | 12/2023 | Lesso | G01N 27/3273 |

(Continued)

OTHER PUBLICATIONS

Akram et al., An Amplifier-Less CMOS Potentiostat IC Consuming 3.7nW Power all over 129.5dB Dynamic Range for Electrochemical Biosensing, ISSCC 2024/Session 3/Analog Techniques/3.6, Feb. 19, 2024.

(Continued)

*Primary Examiner* — Gurpreet Kaur
(74) *Attorney, Agent, or Firm* — Jackson Walker L.L.P.

(57) ABSTRACT

Circuitry for measuring a characteristic of an electrochemical cell, the circuitry comprising: a comparator having a first comparator input, a second comparator input and a comparator output; a feedback path between the comparator output and the second comparator input configured to provide a feedback signal to the second comparator input; an integrator in the feedback path, the integrator comprising a data input coupled to the comparator output and in integrator output; and a loop filter configured to apply filtering to the feedback path to generate the feedback signal, wherein the loop filter comprises the electrochemical cell.

28 Claims, 13 Drawing Sheets

(56) References Cited

U.S. PATENT DOCUMENTS

| | | | |
|---|---|---|---|
| 2005/0252777 | A1 | 11/2005 | Li |
| 2005/0265094 | A1 | 12/2005 | Harding et al. |
| 2007/0163894 | A1 | 7/2007 | Wang et al. |
| 2010/0213079 | A1 | 8/2010 | Willis |
| 2010/0300899 | A1 | 12/2010 | Levine et al. |
| 2014/0021064 | A1 | 1/2014 | Pratt et al. |
| 2014/0266015 | A1 | 9/2014 | Newlin |
| 2014/0375463 | A1 | 12/2014 | Duric |
| 2015/0341046 | A1 | 11/2015 | Schinkel et al. |
| 2018/0219557 | A1 | 8/2018 | Dastgheib et al. |
| 2019/0004000 | A1 | 1/2019 | Jang et al. |
| 2019/0029577 | A1 | 1/2019 | Koelker et al. |
| 2019/0068215 | A1 | 2/2019 | Lesso |
| 2019/0199359 | A1* | 6/2019 | Lesso ........................ H03L 7/10 |

OTHER PUBLICATIONS

International Search Report and Written Opinion of the International Search Authority, International Application No. PCT/GB2022/052184, mailed Nov. 16, 2022.

* cited by examiner $T_0$ $\alpha_0$ $\beta_0$ $V_H$ $V_L$ $T_1$ $\alpha_1$ $\beta_1$

CIRCUITRY FOR ANALYTE MEASUREMENT

The present application is a continuation-in-part of U.S. Nonprovisional patent application Ser. No. 18/498,918, filed Oct. 31, 2023, which is a continuation U.S. Nonprovisional patent application Ser. No. 17/463,796, filed Sep. 1, 2021, issued as U.S. Pat. No. 11,846,600 issued Dec. 19, 2023, each of which is incorporated by reference herein in its entirety.

TECHNICAL FIELD

The present disclosure relates to circuitry for measuring characteristics in electrochemical sensors.

BACKGROUND

Electrochemical sensors are widely used for the detection of one or more particular chemical species, analytes, as an oxidation or reduction current. Such sensors comprise an electrochemical cell, consisting of two or more electrodes configured for contact with an analyte whose concentration is to be ascertained. Such sensors also comprise circuitry for driving one or more of the electrodes and for measuring a response at one or more of the electrodes.

Conventional drive and measurement circuitry in electrochemical sensors comprises several amplifiers, feedback and/or feedback loops in addition to other processing circuitry, such as analog-to-digital converters (ADCs). Such circuitry can take up a large amount of space on-chip, as well as being relatively process intensive, thereby utilising large amounts of power. When electrochemical sensors are battery powered, for example when used in continuous glucose monitoring, it is desirable for such sensors to be as small as possible and use as little power as possible.

SUMMARY

Embodiments of the disclosure aim to address or at least ameliorate one or more of the above issues by reducing the overall power and size of the drive and measurement circuitry required to measure analyte concentration in electrochemical sensors. Specifically, embodiments of the disclosure utilise the filtering characteristics of the electrochemical cell as the filter in a pulse-width-modulation (PWM) circuit, thus saving both power and space. By reducing the size and power of drive and measurement circuitry, multiple electrochemical sensors can be integrated into a single device, thereby either providing redundancy or enabling the sensing of multiple analytes in a single chip. Multiple analyte sensors may be particularly advantageous in applications such as continuous glucose monitoring, where it may be desirable to measure concentrations of glucose, ketones, oxygen, lactate, and the like.

According to a first aspect of the disclosure, there is provided circuitry for measuring a characteristic of an electrochemical cell, the circuitry comprising: a comparator having a first comparator input, a second comparator input and a comparator output; a feedback path between the comparator output and the second comparator input configured to provide a feedback signal to the second comparator input; and a loop filter configured to apply filtering to the feedback path to generate the feedback signal, wherein the loop filter comprises the electrochemical cell.

The comparator may be a hysteretic comparator. The hysteretic comparator may be hysteretic in voltage or hysteretic in time.

The electrochemical cell may comprise at least one working electrode, a counter electrode and a reference electrode. The comparator output may be coupled to the counter electrode. The reference electrode may be coupled to the second comparator input.

The electrochemical cell may comprise at least one working electrode and a counter electrode. The comparator output may be coupled to the counter electrode via a first impedance. The counter electrode may be coupled to the second comparator input.

The first impedance may be provided by an inductor. Alternatively, the first impedance may be provided by a current digital to analog converter (IDAC). The IDAC may be provided in series between the comparator output and the counter electrode. The IDAC may be unipolar or bipolar. Alternatively, the first impedance may be provided by a finite impulse response digital to analog converter (FIR DAC).

The at least one working electrode may be coupled to a reference voltage, which may be variable.

The circuitry may further comprise one or more additional counter electrodes. In which case, the circuitry may further comprise an additional comparator for each of the one or more additional counter electrodes, each additional comparator comprising an additional first comparator input, an additional second comparator input and an additional comparator output. An additional feedback path may be provided between each additional comparator output and each additional second comparator input, configured to provide an additional feedback signal to a respective additional second comparator input. Each additional comparator output may be coupled to a respective additional counter electrode.

The comparator and each additional comparator may be hysteretic. Hysteretic switching of the comparator and each additional comparator may be controlled to minimise interference between the comparator output and each additional comparator output. Controlling the hysteretic switching may comprise staggering hysteretic switching of the comparator and each additional comparator.

The working electrode and each additional working electrode may each be configured to sense a different analyte. As such, the circuitry may be configured to measure concentrations of multiple analytes at the same time. The different analytes may be selected from a non-exhaustive list comprising two or more of glucose, lactates and ketones. These analytes are of particular interest in the monitoring and treatment of diabetes.

The comparator may be synchronous or asynchronous.

In embodiments in which the comparator is asynchronous, the circuitry may further comprise a counter, the comparator output coupled to a data input of the counter. To reduce quantization error associated with the counter, the circuitry may further comprise a voltage-controlled oscillator (VCO) arranged between the comparator output and the data input of the counter.

Bias circuitry may be provided for applying a bias voltage to the first comparator input. The bias circuitry may comprise a filter configured to receive an input voltage and generate the bias voltage.

The filter may comprise an integrator having a first integrator input for receiving the input voltage, a second integrator input and an integrator output. The integrator output may be coupled to the first comparator input and to the first integrator input via a first capacitance. The second integrator input may be coupled to the second comparator input.

The bias voltage may be controlled to vary the limit cycle frequency. The limit cycle may be controlled so as to provide an alternating current (AC) at the comparator output. The limit cycle may be controlled so as to provide a sinusoidal signal at the comparator output.

The circuitry may further comprise hold circuitry configured to hold an electrode of the electrochemical cell at a predetermined voltage. The hold circuitry may be further configured to power down the comparator when the electrode of the electrochemical cell is held at a predetermined voltage.

In some embodiments, chopping may be used to stabilise the circuitry against drift (or DC bias) of components thereof. For example, a polarity of the comparator may be inverted on every other switching cycle of the comparator. The chopping (such as the inversion of the polarity of the comparator) may be synchronised with a rising edge or a falling edge of an output signal at the comparator output. Preferably, chopping is synchronised with a falling edge of the output signal.

According to another aspect of the disclosure, there is provided circuitry for measuring a characteristic of an electrochemical cell, the circuitry comprising: a comparator having a first comparator input, a second comparator input and a comparator output; a feedback path between the comparator output and the second comparator input configured to provide a feedback signal to the second comparator input; an integrator in the feedback path, the integrator comprising a data input coupled to the comparator output and an integrator output; and a loop filter configured to apply filtering to the feedback path to generate the feedback signal, wherein the loop filter comprises the electrochemical cell.

The comparator may be a hysteretic comparator. The integrator may comprise a counter.

The integrator output may be coupled to the electrochemical cell via a first impedance. The electrochemical cell may comprise at least one working electrode and a counter electrode. The integrator output may be coupled to the working electrode via the first impedance.

The working electrode may be coupled to the second comparator input. The electrochemical cell may comprise a reference electrode coupled to the second comparator input.

The first impedance may be provided by a digital to analog converter (DAC). The DAC may be provided in series between an output of the integrator and the counter electrode. The DAC may comprise a current DAC or a finite impulse response digital to analog converter (FIR DAC).

The at least one working electrode may be coupled to a variable reference voltage.

The circuitry may further comprise one or more additional working electrodes; an additional comparator for each of the one or more additional working electrodes, each additional comparator comprising an additional first comparator input, an additional second comparator input and an additional comparator output; an additional feedback path between each additional comparator output and each additional second comparator input configured to provide an additional feedback signal to a respective additional second comparator input, wherein each additional comparator output is coupled to a respective additional working electrode; an additional integrator in each additional feedback path, the additional integrator comprising an additional data input coupled to the additional comparator output and an additional integrator output.

The circuitry may further comprise an auxiliary comparator comprising an auxiliary first input coupled to a reference voltage, an auxiliary second input coupled to a reference electrode of the electrochemical cell, and an output coupled to a second data input of the integrator and each additional integrator.

The comparator and each additional comparator may be hysteretic. Hysteretic switching of the comparator and each additional comparator may be controlled to minimise interference between the comparator output and each additional comparator output.

The circuitry may further comprise a voltage-controlled oscillator arranged between the comparator output and the data input.

The circuitry may further comprise bias circuitry for applying a bias voltage to the first comparator input.

The bias circuitry may comprise a filter configured to receive an input voltage and generate the bias voltage.

The filter may comprise an integrator having a first integrator input for receiving the input voltage, and a second integrator input and an integrator output. The integrator output may be coupled to the first comparator input and to the first integrator input via a first capacitance. The second integrator input may be coupled to the second comparator input.

The bias voltage may be controlled to vary a limit cycle frequency of the comparator.

The circuitry may further comprise hold circuitry configured to hold an electrode of the electrochemical cell at a predetermined voltage.

The hold circuitry may be further configured to power down the comparator when the electrode of the electrochemical cell is held at a predetermined voltage.

A polarity of the comparator may be inverted on every other switching cycle of the comparator. Inversion of the polarity of the comparator maybe synchronised with a rising edge or a falling edge of an output signal at the comparator output.

According to another aspect of the disclosure, there is provided circuitry for measuring first and second characteristics of an electrochemical cell comprising a first working electrode, a second working electrode and a counter electrode, the circuitry comprising: a first comparator having a first comparator input, a second comparator input and a first comparator output; a first feedback path between the comparator output and the second comparator input configured to provide a first feedback signal to the second comparator input; a first loop filter configured to apply filtering to the first feedback path to generate the first feedback signal, wherein the loop filter comprises the electrochemical cell; a second comparator having a third comparator input, a fourth comparator input and a second comparator output; a second feedback path between the comparator output and the fourth comparator input configured to provide a second feedback signal to the fourth comparator input; a second loop filter configured to apply filtering to the second feedback path to generate the first feedback signal, wherein the second loop filter comprises the electrochemical cell.

The first loop filter may comprise the first working electrode. The second feedback path may be via the counter electrode. The second working electrode may be coupled to a fixed reference voltage.

The fourth comparator input may be coupled to the counter electrode.

The fourth comparator input may be coupled to a reference electrode of the electrochemical cell.

According to another aspect of the disclosure, there is provided an electronic device comprising the circuitry described above. The electronic device may be continuous glucose monitor. The device may comprise one of a mobile computing device, a laptop computer, a tablet computer, a games console, a remote control device, a home automation controller or a domestic appliance, a toy, a robot, an audio player, a video player, or a mobile telephone, and a smartphone.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which.

DESCRIPTION OF EMBODIMENTS

Figure 1:
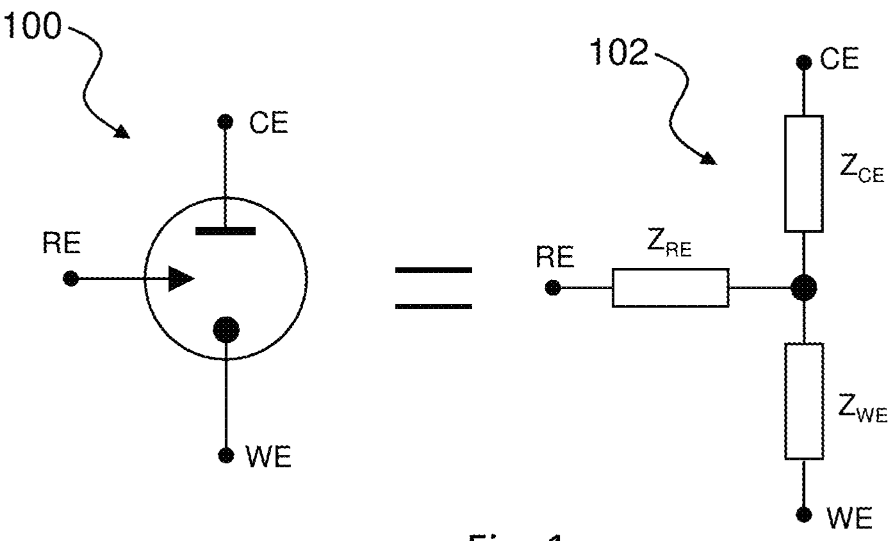
FIG. 1 illustrates a schematic diagram and electrical equivalent circuit for a three-electrode electrochemical cell.

FIG. 1 is a schematic diagram of an electrochemical cell 100 comprising three electrodes, namely a counter electrode CE, a working electrode WE and a reference electrode RE. FIG. 1 also shows an equivalent circuit 102 for the electrochemical cell comprising a counter electrode inductance ZCE, a working electrode inductance ZWE and a reference electrode inductance ZRE.

To determine a characteristic of the electrochemical cell, and therefore an analyte concentration, a measurement current is injected at the counter electrode CE and a current at the working electrode is measured. The reference electrode RE is used to measure a voltage drop between the working electrode WE and the reference electrode RE. The measurement current is then adjusted to keep voltage drop constant. As the resistance in the cell 100 increases, the voltage drop measured at the reference electrode increases. In response, the measurement current injected at the counter electrode CE is decreased. Likewise, as the resistance in the cell 100 decreases, the voltage drop measured at the reference electrode decreases. In response, the measurement current injected at the counter electrode CE is increased. Thus the electrochemical cell 100 reaches a state of equilibrium where the voltage drop between the reference electrode RE and the working electrode WE is maintained constant. Since the current injected at the counter electrode CE and the voltage drop are known, the resistance of the cell 100 can be ascertained.

Figure 2:
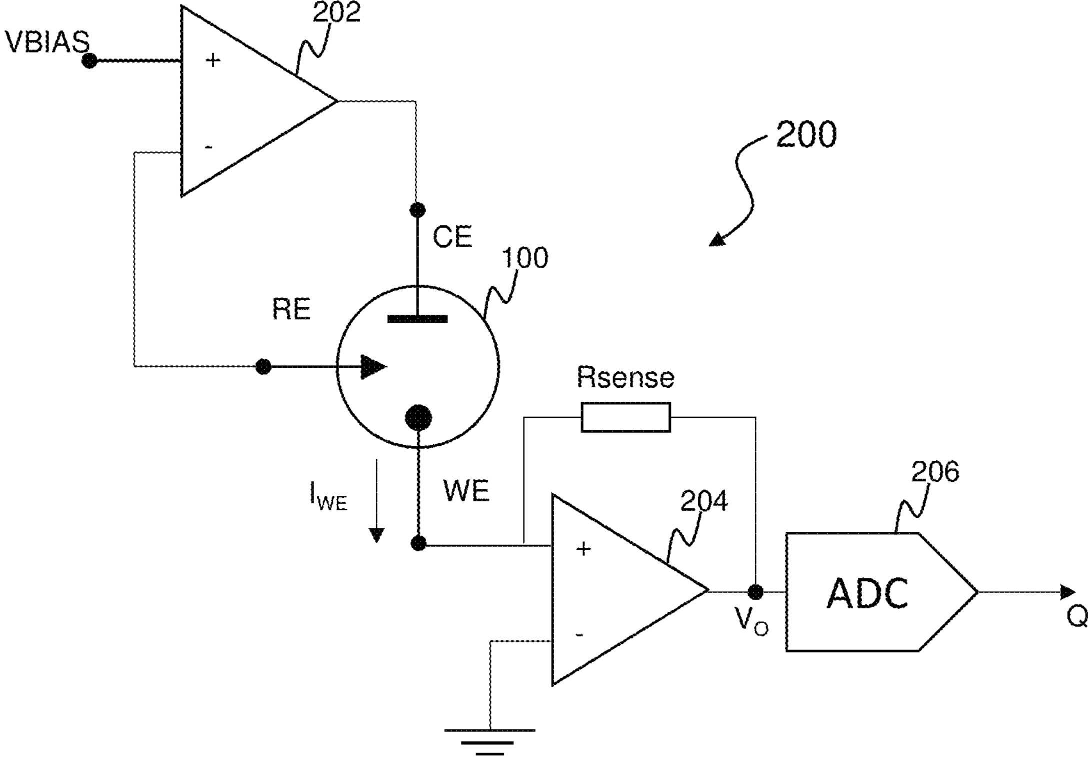
FIG. 2 is a schematic diagram of an example prior art measurement circuit.

FIG. 2 illustrates an example prior art drive and measurement circuit 200 which is configured to implement the above explained cell characterisation, specifically for measuring an analyte concentration in the electrochemical cell 100 shown in FIG. 1. The circuit 200 comprises a comparator 202 and an op-amp 204. A non-inverting input of the comparator 202 is coupled to a bias voltage VBIAS. An inverting input of the comparator 202 is coupled to the reference electrode RE. An output of the comparator is coupled to the counter electrode CE and configured to inject the measurement current. The measurement current injected at the counter electrode CE by the comparator 202 is proportional to the difference between the bias voltage VBIAS and the voltage at the reference electrode RE. As such, the comparator acts to maintain the voltage between the reference electrode RE and the working electrode WE close to the bias voltage VBIAS. A non-inverting input of the op-amp 204 is coupled to the working electrode WE and the inverting input of the op-amp 204 is coupled to a reference voltage, in this case ground. A feedback loop comprising a sense resistor RSENSE is coupled between the non-inverting input and an output of the op-amp 204. The op-amp 204 is thus operable to output a voltage VO which is proportional to the current IWE at the working electrode WE. The output voltage VO is then provided to an analog-to-digital converter (ADC) 206 which outputs a digital output Q which represents the current IWE at the working electrode WE.

It can be seen that the conventional drive and measurement circuit 200 shown in FIG. 2 comprises two op-amps and an ADC. Each of these components not only takes up space on-chip but also consumes a relatively large amount of power.

As mentioned above, embodiments of the disclosure aim to address or at least ameliorate one or more of the above issues by reducing the overall power and size of the drive and measurement circuitry required to measure analyte concentration in electrochemical sensors. Specifically, embodiments of the disclosure utilise the inductive nature and filtering characteristics of the electrochemical cell to act as a filter in a pulse-width-modulation (PWM) circuit, thus saving both power and space.

Figures 3, 4:
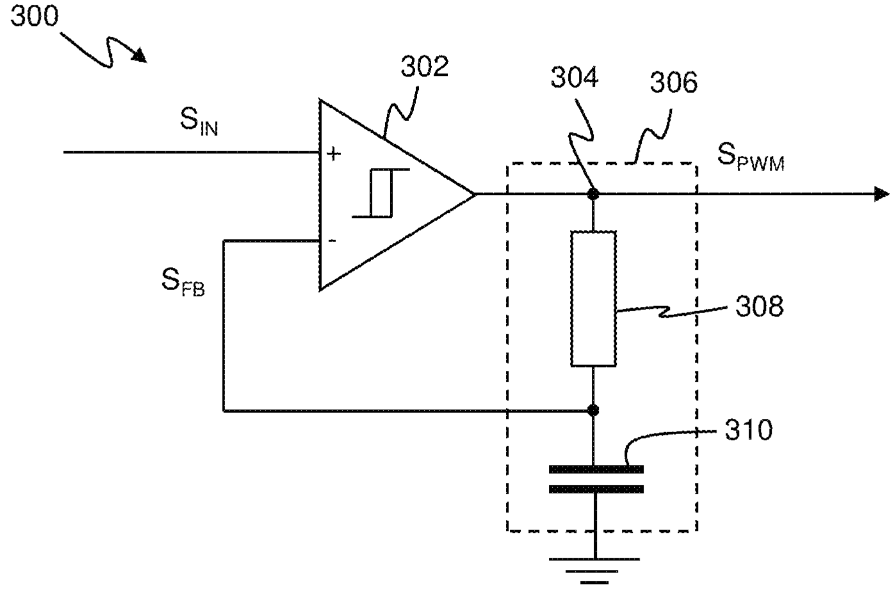
FIG. 3 is a schematic diagram of a pulse width modulation (PWM) circuit.
FIG. 4 is a timing diagram for a PWM signal.

FIG. 3 is a schematic diagram of a PWM circuit 300, also known as a time encoding machine.

Generally, the PWM circuit 300 is configured to receive an input signal SIN, which may for instance be a bias voltage, and generate a pulse-width modulated (PWM) signal SPWM that alternates between different signal levels to encode the difference between the signal level of the input signal SIN and the signal level of the feedback signal SFB by the proportion of time spent in each output state. Typically the PWM signal SPWM may swap between first and second output states and the signal level of the input signal may be encoded by the duty cycle of a first output state, i.e. the proportional of the overall cycle period that corresponds to the first output state, or equivalently the amount of time that the PWM signal SPWM spends in the first output state compared to the second output state.

The PWM circuit 300 comprises a hysteretic comparator 302. In this embodiment the hysteretic comparator 302 is arranged to receive the input signal SIN at a first comparator input, in this example input (+). The hysteretic comparator 302 compares the input signal SIN at the first comparator input with a feedback signal SFB received at a second comparator input, in this example input (−), and applies hysteresis to the comparison to generate the PWM signal SPWM at a comparator output node 304. A feedback path also extends from the comparator output node 304 to the second comparator input, in this example input (−), for providing the feedback signal SFB to the second comparator input. A loop filter arrangement 306 is arranged to apply filtering to the feedback path to provide the feedback signal SFB. In this embodiment the loop filter arrangement 306 comprises a resistive-capacitive (RC) filter having an impedance 308 in the feedback path and a capacitance 310 coupled between the feedback path and a reference voltage, e.g. ground.

The hysteretic comparator 302 compares the signals at the first and second comparator inputs, i.e. the input signal SIN and the feedback signal SFB, and outputs either of two output states, VH and VL, depending on the result of the comparison. The hysteretic comparator 302 is operable to apply hysteresis to the comparison such that a differential voltage between the signals SIN and SFB at the first and second comparator inputs must be greater (i.e. more positive or less negative) than a first threshold to transition from one output state to the other, say from output state VL to the output state VH, but must be lower (i.e. less positive or more negative) than a second, different threshold to make the opposite transition, e.g. to swap from the output state VH to the output state VL. The difference between these first and second thresholds corresponds to the amount of hysteresis applied. In some implementations the first and second thresholds may be equal in magnitude and opposite in polarity, i.e. the difference between the input signal SIN and the feedback signal SFB must be greater than an amount +H to transition to one state, say VH, and must be lower than −H to transition to the other state, say VL. In this instance the magnitude of H can be seen as a measure of the hysteresis applied by the hysteretic comparator 302 and the hysteresis applied is symmetric. It will be understood however that the hysteresis applied could be asymmetric in some implementations.

In some embodiments the output states VH and VL may be high and low voltage levels respectively, for instance a supply voltage VDD (VH) and ground (VL), or a positive voltage V+ (VH) and a negative voltage V− (VL), possibly of equal magnitude. Thus the PWM signal SPWM transitions between two output voltage states.

The input signal SIN is thus compared to the feedback signal SFB which is derived from the output PWM signal SPWM. The feedback signal SFB corresponds to a filtered version of the PWM signal SPWM and the filter arrangement 306 provides some delay and signal averaging over time. Thus if the PWM signal SPWM transitions to the high state VH, the feedback signal SFB will, initially, be lower than the present state of the PWM signal SPWM and will begin to increase, i.e. become more positive, over a period of time. The delay and signal averaging applied to the PWM signal SPWM is thus dependent on the characteristics of the filter arrangement 306 and any changes in the characteristics of the filter arrangement 306 will lead to a change in the feedback signal SFB. This phenomenon is the basis of operation of the PWM circuit 300 for the measurement of characteristics of the electrochemical cell 100, as will be described in more detail below.

If the input signal SIN itself is constant over that period of time and the filter characteristic of the filter arrangement 306 is also constant, the difference between the input signal SIN and the feedback signal SFB will decrease, i.e. become less positive/more negative, until the relevant threshold is reached and the PWM signal SPWM transitions to the other output state VL. At this point the value of the feedback signal SFB will start to decrease. The hysteretic comparator 302 will maintain the low state VL until the difference between the input signal SIN and the feedback signal SFB increases, i.e. becomes less negative/more positive, to the second threshold.

Note that the arrangement illustrated in FIG. 3 assumes that the input signal SIN and the feedback signal SFB are in a range within the voltage range of the output state VH and VL and are referenced to a midpoint voltage VMID which is equal to the midpoint voltage between VH and VL. If necessary, level shifting and/or scaling could be applied to at least one of the input signal SIN or feedback signal SFB.

Thus if the input signal SIN and the feedback signal SFB maintain a constant level, the output of the hysteretic comparator 302 will continually cycle between the first and second output states VH and VL. The time spent in each output state will depend on how long it takes for the feedback signal SFB to change by the amount defined by the hysteresis, e.g. from a value equal to SIN−H to a value SIN+H or vice versa. This will depend on the amount of hysteresis and the rate of change of the feedback signal SFB, which itself is dependent on the filter characteristic of the filter arrangement 306. However the rate of change of the feedback signal SFB will depend on the then-current value of the feedback signal SFB, in particular the difference between the level of the output state, i.e. VH or VL, and the value of the feedback signal SFB, which in turn depends on the level of the input signal SIN and the characteristics of the filter arrangement 306.

The duration of a pulse corresponding to the high state VH in the PWM signal SPWM (and correspondingly the duration of a pulse corresponding to the low state VL in the PWM signal SPWM) thus depends on the level of the input signal SIN and the characteristics of the filter arrangement 306. Where the input signal SIN is constant, the PWM encodes the filter characteristics of the filter arrangement 306 as the duty cycle of the PWM signal SPWM, i.e. the ratio between the duration of a pulse of a first output state, say VH, to the duration of the cycle period.

FIG. 4 illustrates the principles of the PWM signal SPWM of the PWM circuit 300 shown in FIG. 2. The PWM signal SPWM varies between the two output states VH and VL. The duration of a pulse of the high state VH is denoted by a and the duration of a pulse of the low state VL is denoted by $\beta$. The cycle period T is equal to $\alpha+\beta$. For cycles which do not correspond to duty cycles of 100% or 0% the cycle period T can also be seen as the period between an instance of a transition from one output state to the other output state and the next instance of the same transition.

As described above the duration $\alpha$ of the pulse of the high state VH depends on the level of the input signal SIN and the characteristics of the filter arrangement 306, as does the duration of the pulse of the low state VL. For signals of zero magnitude (which corresponds to a signal reference voltage value equal to the midlevel voltage VMID between VH and VL) the periods of the pulses of each state, illustrated in FIG. 4 as $\alpha 0$ and $\beta 0$, will be equal to one another, i.e. each equal to T0/2 where T0 is the cycle period at zero magnitude. If the delay in the filter arrangement 306 increases, the duration of the pulse of one state will increase and the duration of the pulse of the other state will decrease.

Thus any increase in the delay of the filter arrangement 306 will result in an increase in the cycle period, as illustrated by the durations $\alpha 1$ and $\beta 1$ and duration T1 for a cycle period at a non-zero input signal magnitude. Thus the cycle period T0 (equal to $\alpha 0+\beta 0$) corresponding to an input signal of zero magnitude will be the cycle period of shortest duration. This condition is referred to as the limit cycle and the period T0 is the limit cycle period. This corresponds to the fastest cycle frequency f0=1/T0 which is referred to as the limit cycle frequency.

Embodiments of the present disclosure at least partially replace the filter arrangement 306 shown in FIG. 3 with an electrochemical cell, such as the cell 100 shown in FIG. 1. The electrochemical cell acts as a filter having an RC characteristic. With the input signal Sin set to a constant bias voltage VBIAS, changes in the impedance characteristic of the cell 100 are translated to changes in the cycle period of the PWM signal SPWM.

Figure 5:
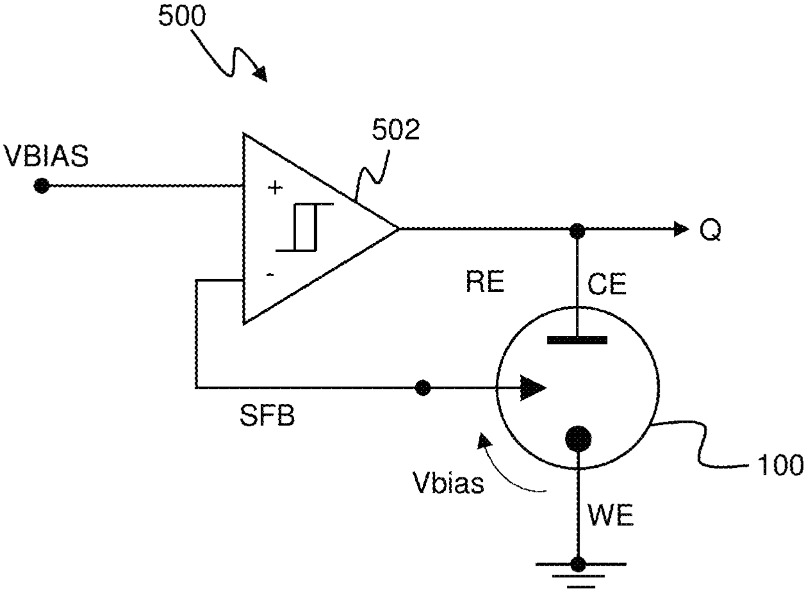
FIG. 5 is a schematic diagram of a measurement circuit for measuring characteristics of an electrochemical cell.
Figure 6:
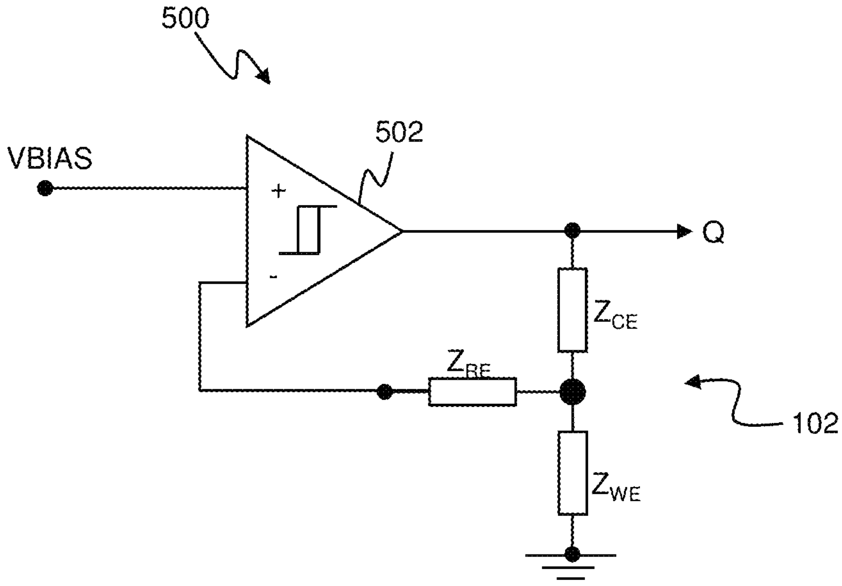
FIG. 6 is a schematic diagram of a measurement circuit for measuring characteristics of an electrical equivalent of the electrochemical cell shown in FIG. 5.

FIGS. 5 and 6 respectively show an exemplary measurement circuit 500 comprising the electrochemical cell 100 of FIG. 1 and the same measurement circuit 500 with the equivalent impedance circuit 102, also shown in FIG. 1. It can be seen that the electrochemical cell 100 forms a filter in the feedback path between the output and a first input (in this case inverting) of a hysteretic comparator 502. A second input (in this case non-inverting) is coupled to a known bias voltage VBIAS. Since the bias voltage is known, the PWM output Q is encoded by the impedances ZRE, ZCE, ZWE of the electrochemical cell 100.

Figure 7:
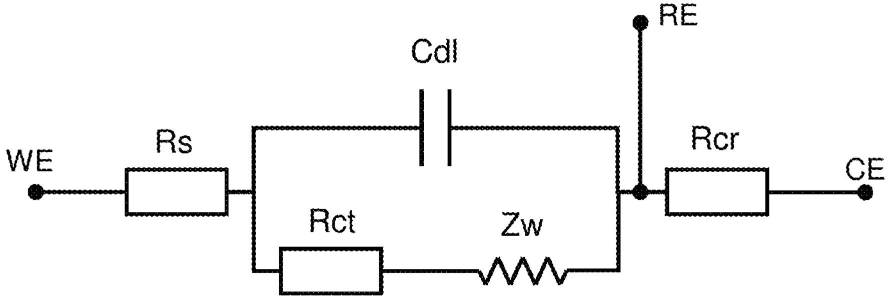
FIG. 7 is a diagram of a Randles equivalent circuit.

FIG. 7 shows an equivalent circuit 700 which may be used to approximate the impedances ZCE, ZWE, ZRE of the counter, working and reference electrodes CE, WE, RE. The circuit 700 incorporates a Randles circuit (a known equivalent circuit for modelling an electrode immersed in an electrolyte). The circuit 700 comprises an electrolyte (or ionic) resistance Rs in series with the parallel combination of a double layer capacitance Cdl and an impedance of a faradaic reaction. The impedance of the faradaic reaction comprises an active charge transfer resistance Rct in series with an electrochemical diffusional resistance, known as the Warburg impedance Zw. The Randles circuit is known in the art and so will not be described in more detail here. The combined impedance of the counter and reference electrodes CE, RE are represented by a resistance Rcr.

From this circuit, it can be seen that as the analyte concentration increases in the cell 100, the charge transfer resistance Rct decreases, leading to a change in impedance associated with the feedback path. This in turn leads to a change of the time the output signal Q stays at each output state VH, VL. As such, the output signal Q is a PWM signal which is encoded with information concerning the concentration of an analyte in the cell 100.

Using a hysteresis comparator 502 as opposed to a conventional non-hysteresis comparator results in fewer toggles or switches of the comparator 502 and therefore a reduction in power consumption. Additionally, the PWM output Q from the hysteresis comparator 502 can be easily decoded, either by considering it as a single bit output or by treating it as a PWM waveform directly. This provides a further reduction in the processing power required to characterise the cell 100.

Figure 8:
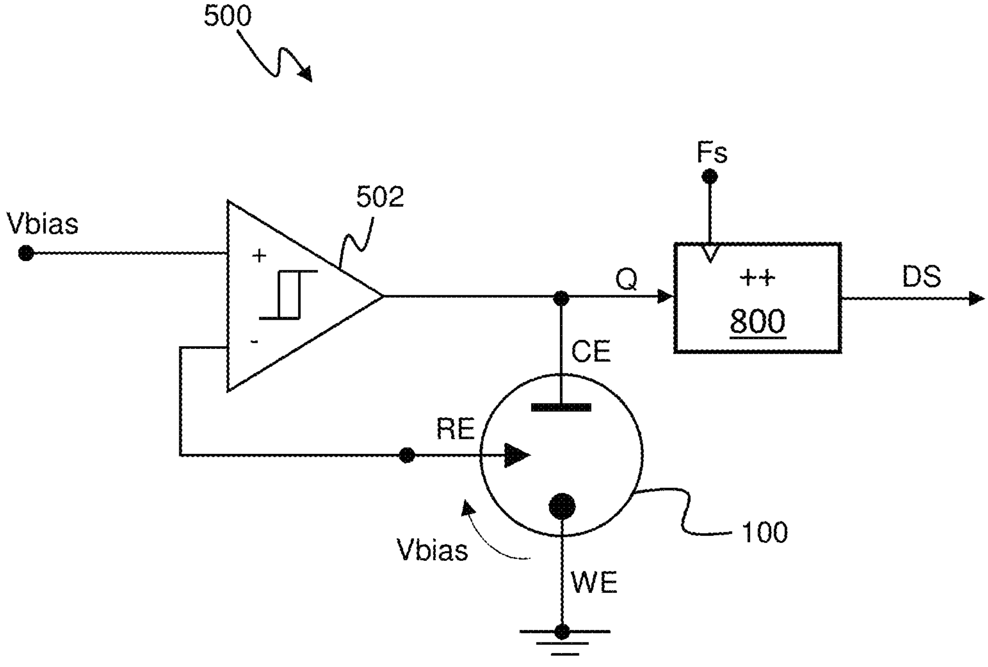
FIG. 8 is a schematic diagram of a decoder configured to decode an output of the measurement circuit shown in FIG. 5.

FIG. 8 shows an example decoder 800 for decoding the PWM signal Q output from the hysteresis comparator 502. The decoder 800 comprises a counter clocked with a clock signal Fs having a higher frequency than the frequency of the output signal Q. The output signal Q from the comparator 502 is provided as a data input to the decoder 800. The decoder 800 is configured to count the number of periods or oscillations of the clock signal Fs in a single period of the output signal Q. The decoder 800 then outputs this count as a digital count output DS. It will be appreciated that the quantisation error of the decoder 800 is determined by the time resolution of the counter, which itself depends on the frequency of the clock signal Fs. In some embodiments, the rising edge of the output signal Q may be synchronised to the clock signal Fs.

To reduce quantisation error, a voltage-controlled oscillator (VCO), not shown, may be arranged at the input of the decoder 800 and configured to output an oscillation signal where the frequency of the oscillations depends on the level of the input to the VCO. The counter would then be arranged to receive the oscillation signal from the VCO and count the number of oscillations in a frame period defined by the clock signal Fs. Over the course of several frames, the average count value will depend on the amount of time that the time-encoded signal Q spends in one state, thus controlling the VCO 104 to output a first frequency, compared to the amount of time that the output signal Q spends in the other state, thus controlling the VCO to output a second frequency. Thus, the average count value is related to the duty cycle of the output signal Q.

The use of a VCO provides some noise shaping, as would be understood by one skilled in the art. The quantisation error at low frequencies associated with decoder 800 is reduced as any error in one frame, e.g. any difference between the clock edge defining the end of the frame and the end of the oscillation at the end of the frame, is carried forward to the next frame. The quantisation noise at higher frequencies is increased, but this may be readily removed by downstream digital filtering without affecting the audio signal frequency band. The use of a VCO thus allows accurate conversion with clock rates that are significantly lower than the clock rates required when using a counter alone.

In FIGS. 5 and 6, the hysteresis comparator 502 is asynchronous. When the output Q is decoded by a decoder such as the decoder 800 described above, quantisation error will be introduced. To ameliorate quantisation error, some embodiments of the disclosure may implement synchronous hysteretic comparison in which transitions in the time-encoded signal are synchronised to a clock signal.

Figure 9:
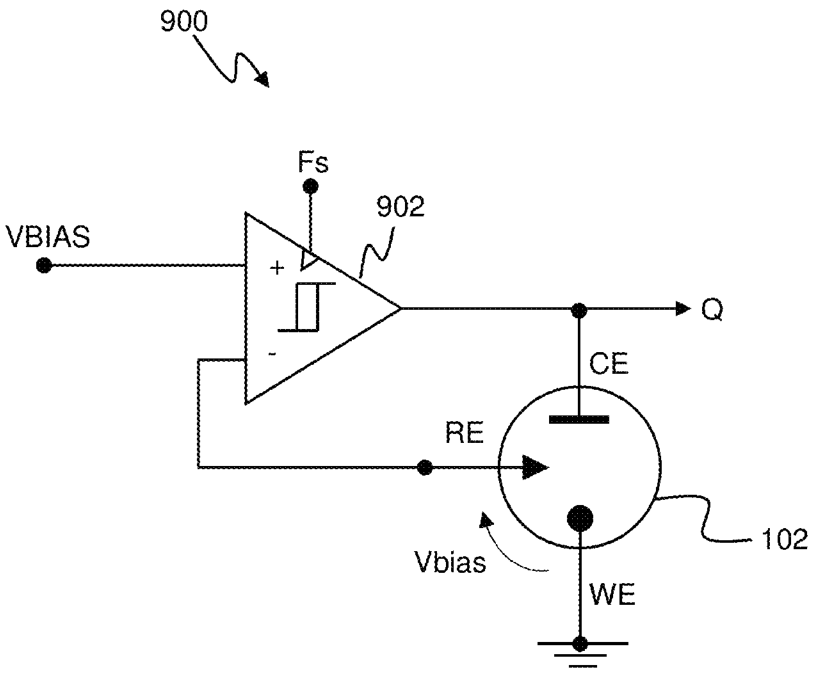
FIG. 9 is a schematic diagram of a synchronous measurement circuit for measuring characteristics of an electrochemical cell.

FIG. 9 is a schematic diagram of an example measurement circuit 900 which is similar to the measurement circuit 500 shown in FIG. 5, but comprising a synchronous (or latched) hysteresis comparator 902 in place of the asynchronous comparator 502. In practice, the synchronous hysteresis comparator 902 may be implemented using the combination of an asynchronous hysteresis comparator having a latch configured at its output.

The synchronous hysteresis comparator 902 is clocked with a clock signal Fs. Thus, transitions of the output signal Q are synchronised to the clock signal Fs and so the period $\alpha$ of a pulse of the output signal Q of one state and the period $\beta$ of a pulse of the other state are synchronised to the clock signal Fs. By synchronising the transitions in the time-encoded signal to the clock signal Fs, a counter such as that shown in FIG. 8, which is clocked by the clock signal Fs (or a synchronous clock signal derived therefrom) can be used to produce count values corresponding to the duration of the time-encoded signal directly, without any quantisation error being introduced by the counter.

During operation, when the output Q of the hysteretic comparator 902 is in the high state the capacitance of the cell 102 will charge until the voltage at the second (inverting) comparator input is equal to Q+H. At this point, at the next relevant clock edge of the clock signal Fs, the output of the hysteretic comparator 902 will swap to the low state and the capacitance of the cell 102 will start discharging until the voltage drops to SIN−H. The rate of charging and discharging will depend on the voltage difference across the resistance of the cell 102. As explained above, voltage across the capacitance of the cell 102 will vary between SIN−H and SIN+H, and thus the rate of charging or discharging of capacitance of the cell thus depends on the error between the output state and the voltage VBIAS at the first (non-inverting) input of the comparator 902.

Whilst the embodiments shown in FIGS. 5, 8 and 9 are hysteretic in voltage, embodiments of the disclosure are not limited to voltage hysteresis.

Figure 10:
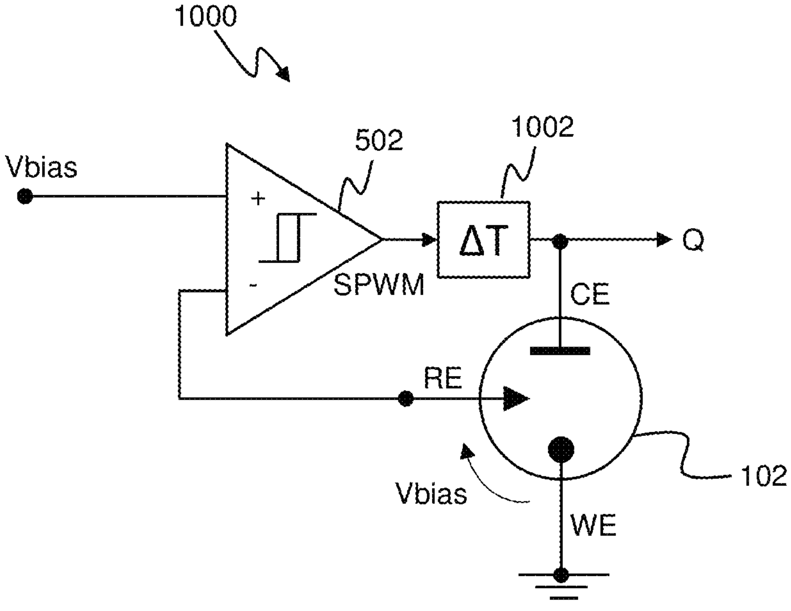
FIG. 10 is a schematic diagram of a measurement circuit for measuring characteristics of an electrochemical cell.

FIG. 10 is a schematic diagram of a measurement circuit 1000, a variation of the measurement circuit 500 shown in FIG. 4 but which is hysteretic in time. Like parts have been given like numerals. The measurement circuit 1000 further comprises a delay element 1002 configured to apply a controlled delay within the feedback loop of the comparator 502. As such, there is a delay between a change in output state of the comparator 502, i.e. a change in state of the PWM signal from the high output state VH to the low output state VL or vice-versa, and a corresponding change in state of the second input signal provided to the comparator 502, i.e. a change from ramping-up to ramping-down or vice-versa. In some embodiments the delay element 1002 may comprise a variable delay element which can be controlled to selectively vary the amount of delay applied. By controlling the delay applied by the delay element 1002, the cycle frequency of the output signal Q can be controlled. The benefits of such control will be described in more detail below.

In this embodiment, both hysteresis and a controlled delay are applied in the feedback loop. A cycle frequency of the output signal Q from comparator 502 thus depends on both the delay applied by the delay element 1002 and the amount of hysteresis applied by the comparator 502, which in turn (as explained above) depends on the impedance characteristics of the cell 102.

In this case, the output signal Q is a delayed version of the PWM signal SPWM. In other embodiment, there may also (or alternatively) be a delay element in the feedback path, for example between the reference electrode RE and the second input of the comparator 1102.

The effect of the use of delay in PWM circuits is described in detail in U.S. Pat. No. 10,348,282 B1, the contents of which is hereby incorporated by reference in its entirety.

Figure 11:
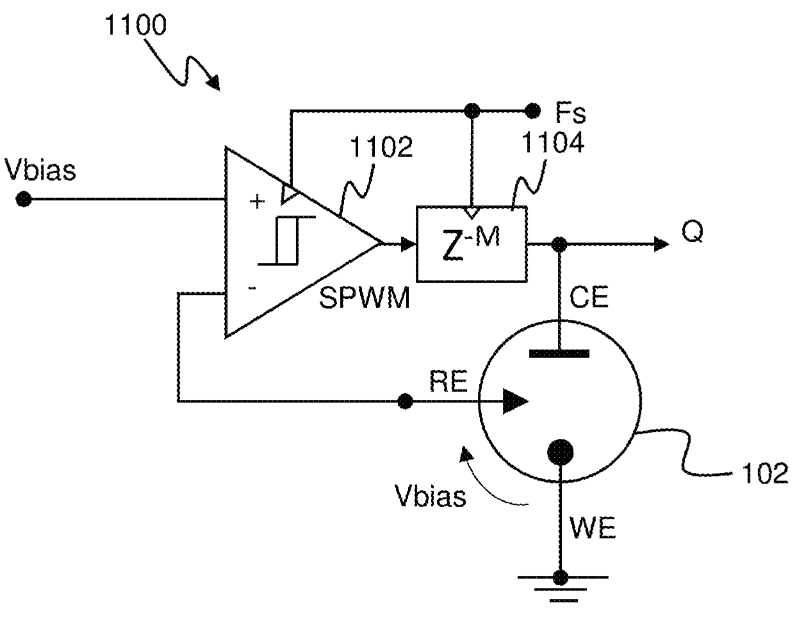
FIG. 11 is a schematic diagram of a measurement circuit for measuring characteristics of an electrochemical cell.

FIG. 11 shows a measurement circuit 1100 which is a synchronous variation of the measurement circuit 1000 shown in FIG. 10. The measurement circuit 1100 comprises a synchronous (or latched) comparator 1102 and a synchronised delay element 1104. The comparator 1102 is configured such that any signal transitions in the output from the modulator are synchronised to a clock signal Fs and the delay element 1104 comprises a digital delay element which is synchronised to the clock signal Fs.

Embodiments above are described with reference to a three-electrode cell 102 comprising a counter electrode CE, a working electrode WE and a reference electrode RE. Embodiments of the disclosure are not, however, limited to having three-electrodes. The concepts described herein are equally applicable to two-electrode cells.

Figure 12:
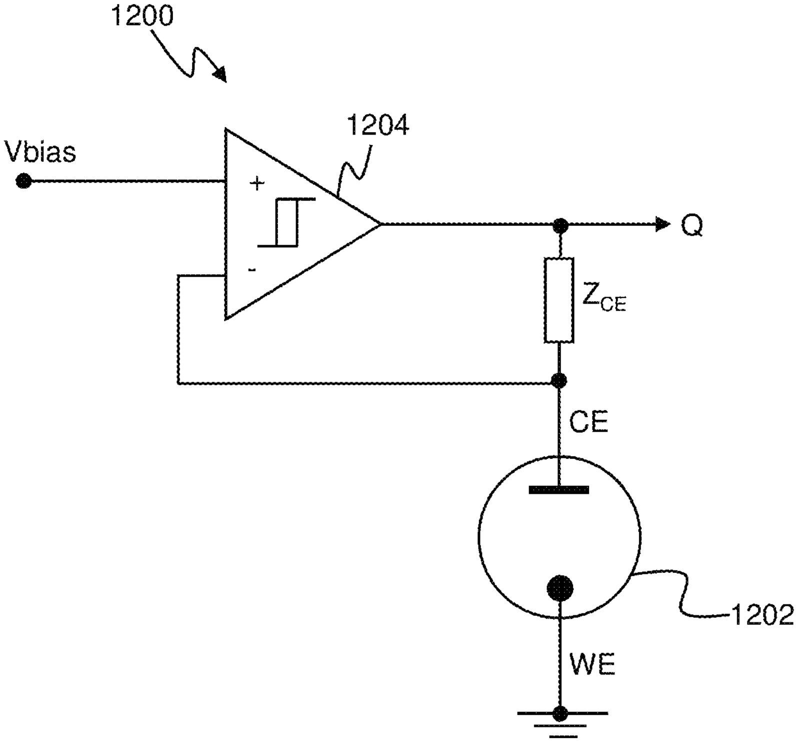
FIG. 12 is a schematic diagram of a measurement circuit for measuring characteristics of a two-electrode electrochemical cell.

FIG. 12 illustrates a measurement circuit 1200 comprising a two-electrode cell 1202, a hysteretic comparator 1204, and an impedance ZCE. Referring again to FIG. 3, the PWM circuit 300 comprises a loop filter arrangement 306 with an impedance 308 in the feedback path and the capacitance 310 coupled between the feedback path and a reference voltage. The measurement circuit 1200 also has an impedance Zce in the feedback path. However, in contrast to the PWM circuit 300, the capacitance 310 is replaced with the two-electrode cell 1202 coupled between the feedback path and the reference voltage (ground in this example). The counter electrode CE of the two-electrode cell 1202 is coupled to the feedback path and the working electrode WE of the two-electrode cell 1202 is coupled to the reference voltage.

Thus, the impedance Zce and the impedance of the cell 1202 act as a loop filter arrangement in a similar manner to the loop filter arrangement 306 of the PWM circuit 300 shown in FIG. 3. As such, variations in the impedance of the cell 1202 lead to changes in the delay applied in the feedback path between the output and second input of the hysteresis comparator 1204. It is preferable that the impedance Zce be much greater than the impedance of the cell 1202 so that the current injected at the counter electrode CE of the cell 1202 can be accurately controlled.

The impedance Zce of the measurement circuit 1200 may be implemented in several ways. Two non-limiting examples are shown in FIGS. 13 and 14.

Figure 13:
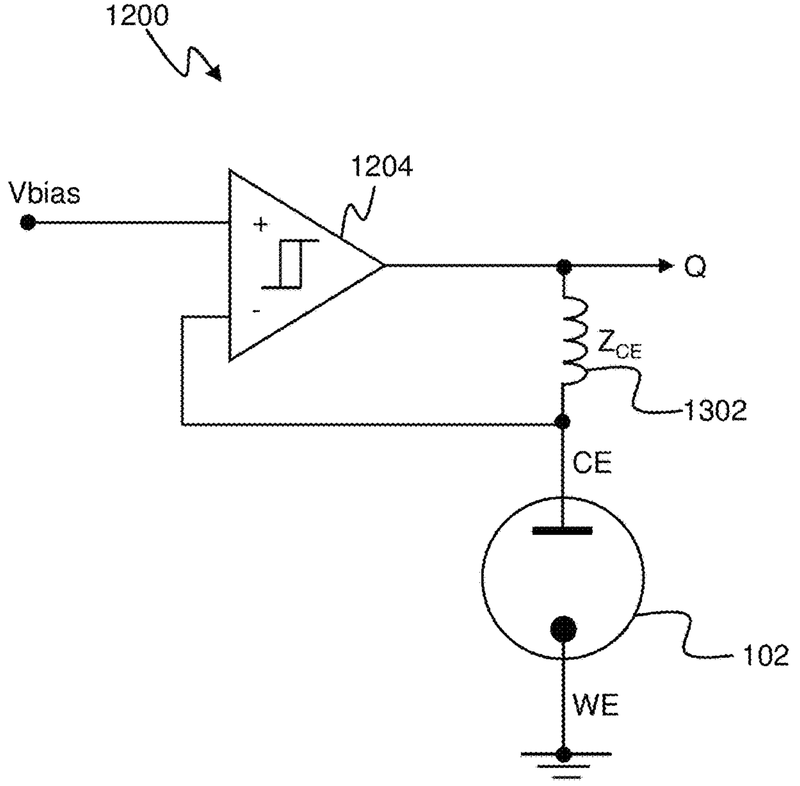
FIG. 13 is a schematic diagram of a measurement circuit for measuring characteristics of a two-electrode electrochemical cell.

FIG. 13 is a first example of the measurement circuit 1200 shown in FIG. 12. In this example the impedance Zce is provided by an inductor 1302 which provides the high output impedance Zce for the comparator 1204.

Figure 14:
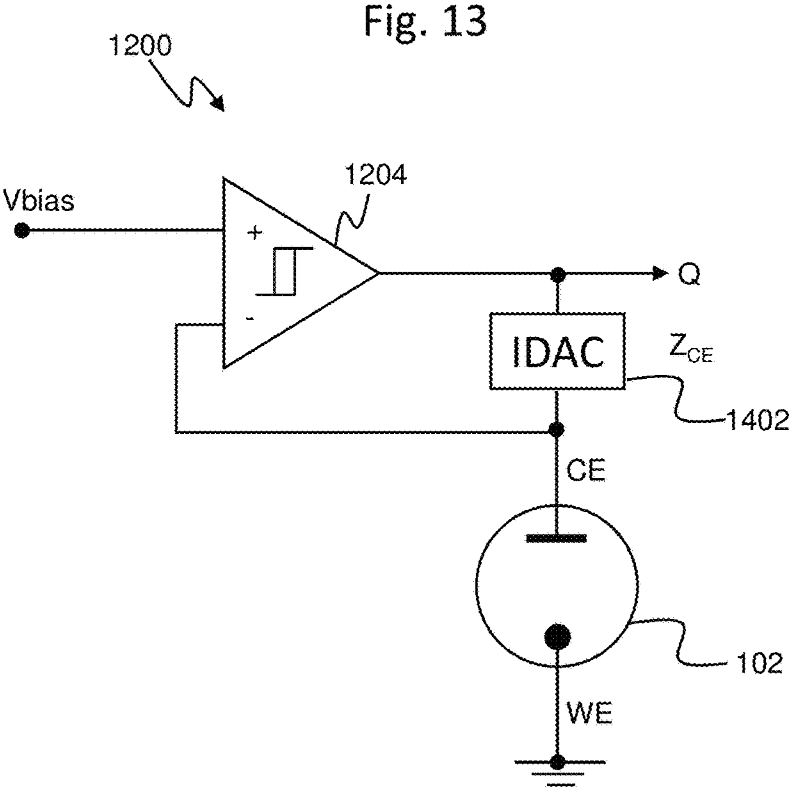
FIG. 14 is a schematic diagram of a measurement circuit for measuring characteristics of a two-electrode electrochemical cell comprising a current digital-to-analog converter (IDAC)

FIG. 14 is a second example of the measurement circuit 1200 in which the impedance Zce is provided by a current digital-to-analog converter (IDAC) 1402. The IDAC 1402 is configured to inject a current at the counter electrode CE which is dependent on the respective durations $\alpha 1$ and $\beta 1$ of the output signal Q.

Figure 15:
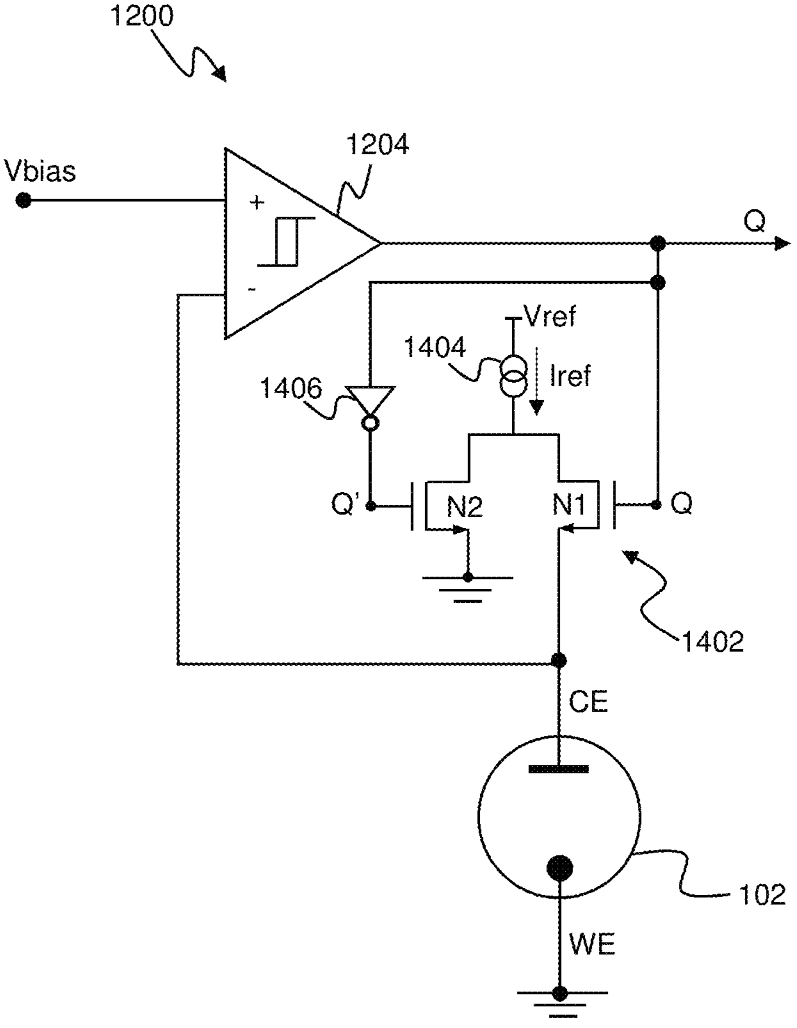
FIG. 15 is a schematic diagram of the measurement circuit of FIG. 14 showing the IDAC in more detail.

FIG. 15 shows an example implementation of the IDAC 1402. The IDAC 1402 comprises a pair of transistors N1, N2 having their respective drains coupled to a current source 1404. The source of the first transistor N1 is coupled to a ground reference voltage. The source of the second transistor N2 is coupled to the counter electrode CE. The gates of the first and second transistors N1, N2 are provided with the output signal Q and the complement Q' of the output signal Q, respectively. An inverter 1406 is provided to generate the complement Q' if the output signal Q. Thus, the output of the current source 1404 is switched between the counter electrode CE (via the first transistor N1) and the ground reference (via the second transistor N2). The duration spent in each state is dependent on the respective durations $\alpha 1$ and $\beta 1$ of the output signal Q. In the embodiment shown in FIG. 15, the first and second transistors N1, N2 are PMOS devices. In the embodiments NMOS devices may be used (or any other suitable switching devices known in the art). In the embodiment shown in FIG. 15, the IDAC 1402 switches the counter electrode CE between Iref and ground. In other embodiments, a bipolar implementation of the IDAC 1402 may be used, for example to switch the counter electrode between Iref and −Iref.

Embodiments of the disclosure described herein aim to reduce the overall power and size of the drive and measurement circuitry required to measure analyte concentration in electrochemical sensors. It will therefore be appreciated that it is advantageous to be able to disconnect or powered down one or more elements of the measurement circuits 500, 900, 1000, 1100, 1200 described above, whilst not substantially affecting the performance of the electrochemical cell 102.

In a variation of the embodiment shown in FIG. 14, the IDAC 1402 may be replaced with a finite impulse response DAC (FIR DAC).

Accordingly, in some embodiments, hold circuitry may be introduced to enable each of the measurement circuits 500, 900, 1000, 1100, 1200 to be switched into a hold mode. The hold mode may act to pause measurement, such that one or more components may be powered down. To do so, the hold circuitry preferably holds the counter electrode at a predetermined voltage.

Figure 16:
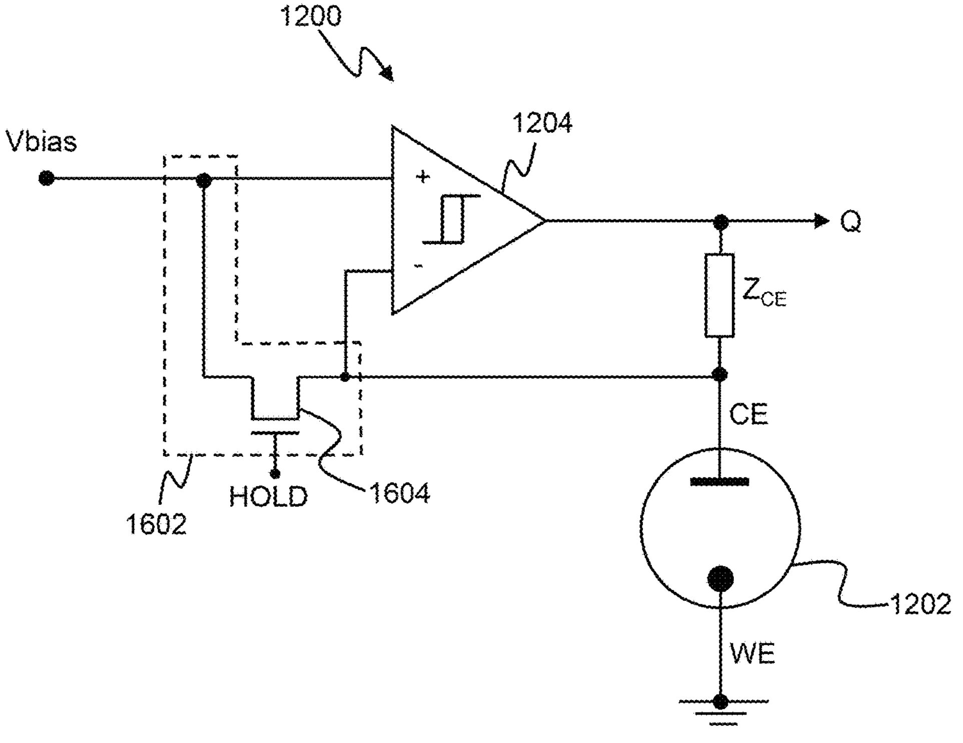
FIG. 16 is a schematic diagram of a measurement circuit for measuring characteristics of a two-electrode electrochemical cell comprising a hold circuit.

FIG. 16 illustrates an example hold circuit 1602 implemented in the measurement circuit 1200 of FIGS. 12 to 15. The hold circuit 1602 comprises a switch 1604 (in this instance a transistor) coupled between the inverting input of the comparator 1204 and the non-inverting input of the comparator 1204. The switch 1604 is controlled by a hold signal HOLD. The measurement circuit 1200 may be moved into the hold state by closing the switch 1604 (using the hold signal HOLD) to hold the counter electrode CE at the predetermined voltage, in this case Vbias. The comparator 1204 may then be powered down between measurements to minimise power consumption between measurement events. For measurement, comparator 1204 may be powered up and the switch 1604 opened to resume measurement.

In the embodiments described above, a single order loop filter is provided in each of the measurement circuits 500, 900, 1000, 1100, 1200. In some applications, it may be advantageous to increase the order of the loop filter used for hysteresis.

Figure 17:
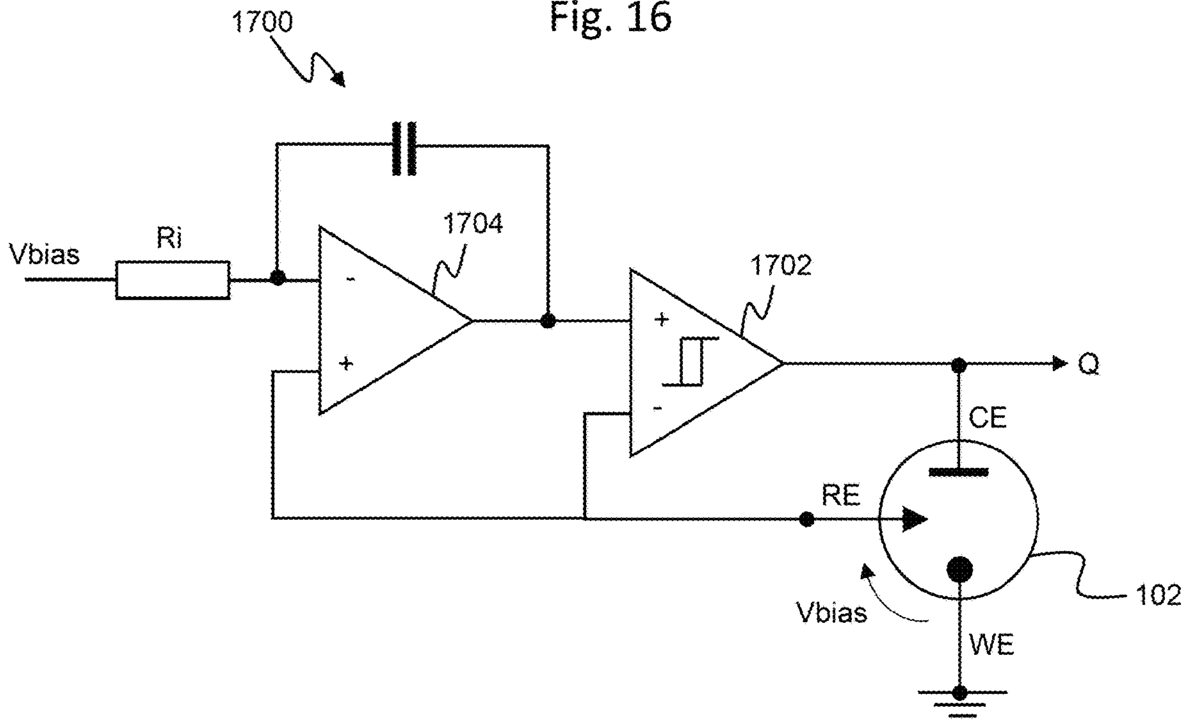
FIG. 17 is a schematic diagram of a measurement circuit for measuring characteristics of a two-electrode electrochemical cell with a second order feedback loop.

FIG. 17 illustrates one such example measurement circuit 1700 which comprises a hysteretic comparator 1702, the electrochemical cell 102 and an op-amp based integrator 1704. In this example the output signal Q serves a feedback signal which is filtered by the electrochemical cell 102 and the integrator 1704. The integrator 1704 is provided between the input bias voltage VBIAS and a first (non-inverting) input of the comparator 1702. The bias voltage VBIAS is provided to a first (inverting) input of the integrator 1704. The second (non-inverting) input of the integrator is coupled to the reference electrode. As such, the integrator 1704 is configured to integrate the input voltage VBIAS in the forward path. It will be appreciated that FIG. 15 provides just one of several example topologies for implementing multi-order filtering in the feedback loop.

Figure 18:
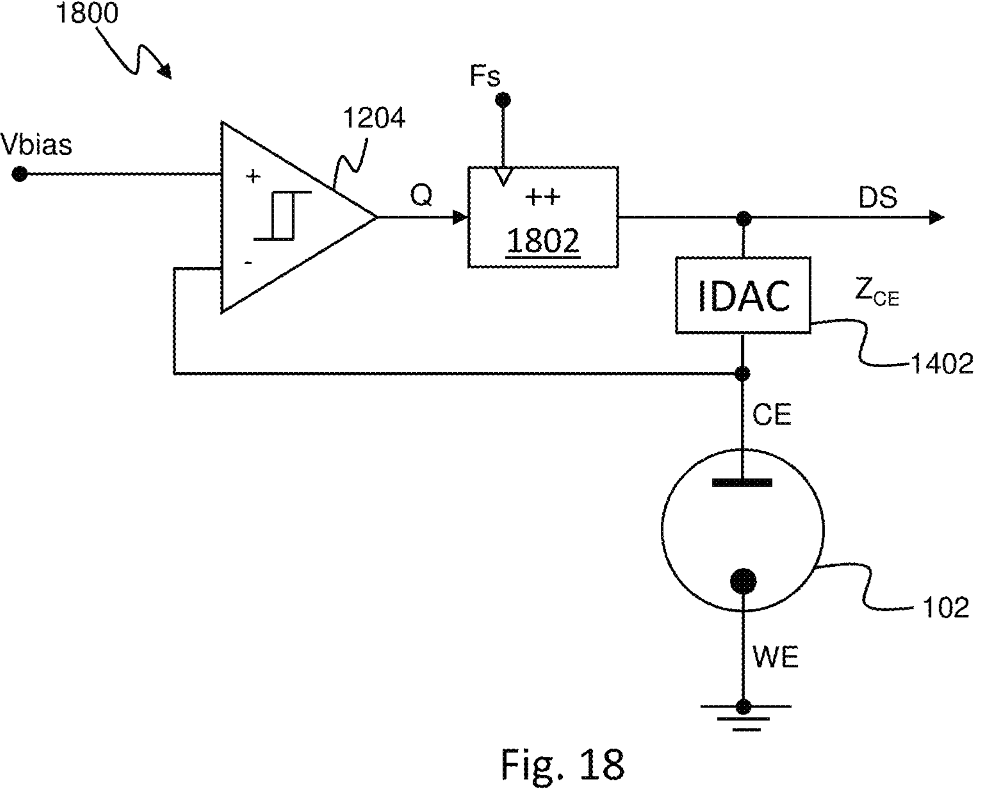
FIG. 18 is a schematic diagram of a measurement circuit for measuring the characteristics of an electrochemical cell.

FIG. 18 illustrates a measurement circuit 1800 which is a variation of the measurement circuit 1200 shown in FIG. 14. As with the example measurement circuit 1200 in FIG. 14, the impedance Zce is provided in the measurement circuit 1800 by a current digital-to-analog converter (IDAC) 1402. The measurement circuit 1800 differs from that shown in FIG. 14 by the addition of a decoder 1802 provided between the output of the comparator 502 and the input of the IDAC 1402. Optionally, the comparator 1204 can be latched with the clock signal Fs.

The decoder 1802 may be implemented in a similar manner to the decoder 1802 of the circuit 500 shown in FIG. 8. The decoder 1802 may decode the PWM signal Q output from the hysteresis comparator 1204. The decoder 1802 comprises a counter clocked with a clock signal Fs having a higher frequency than the frequency of the output signal Q. The output signal Q from the comparator 1204 is provided as a data input to the decoder 1802. The decoder 1802 is configured to count the number of periods or oscillations of the clock signal Fs in a single period of the output signal Q. For example the decoder 1802 may be arranged to count up when Q is high, and to count down when Q is low. The decoder 1802 then outputs this count as a digital count output DS. It will be appreciated that the quantisation error of the decoder 1802 is determined by the time resolution of the counter, which itself depends on the frequency of the clock signal Fs. In some embodiments, the rising edge of the output signal Q may be synchronised to the clock signal Fs.

To reduce quantisation error, a voltage-controlled oscillator (VCO), not shown, may be arranged at the input of the decoder 1802 and configured to output an oscillation signal where the frequency of the oscillations depends on the level of the input to the VCO. The decoder 1802 would then be arranged to receive the oscillation signal from the VCO and count the number of oscillations in a frame period defined by the clock signal Fs. Over the course of several frames, the average count value will depend on the amount of time that the time-encoded signal Q spends in one state, thus controlling the VCO 104 to output a first frequency, compared to the amount of time that the output signal Q spends in the other state, thus controlling the VCO to output a second frequency. Thus, the average count value is related to the duty cycle of the output signal Q.

The use of a VCO provides some noise shaping, as would be understood by one skilled in the art. The quantisation error at low frequencies associated with decoder 1802 is reduced since any error in one frame (e.g. any difference between the clock edge defining the end of the frame and the end of the oscillation at the end of the frame) is carried forward to the next frame. The quantisation noise at higher frequencies is increased, but this may be readily removed by downstream digital filtering without affecting the audio signal frequency band. The use of a VCO thus allows accurate conversion with clock rates that are significantly lower than the clock rates required when using a counter alone.

As noted above, the output of the decoder 1802 is provided to the IDAC 1402, which is configured to inject a current at the counter electrode CE which is dependent on the digital count output DS. Alternatively, the IDAC 1402 may be coupled with the working electrode WE.

By providing the decoder 1802 between the output of the comparator 1204 and the input of the IDAC 1402, the size of any step in current at the input of the IDAC 1402 is reduced when compared to not having the decoder 1802. This in turn reduces voltage ripple across the cell 102, particularly where the resistance between the counter and working electrodes CE, WE is large (which is the case for potentiostats). Reducing voltage ripple across the cell 102. In addition to reducing currents steps at the input of the IDAC 1402, providing the decoder 1802 as described reduces quantization noise in the output of the IDAC 1402 in addition to jitter sensitivity.

It will be appreciated that the hysteretic nature of the comparator 1204 in combination with the decoder 1802 provides several advantages. Firstly, there is a limit cycle that can be used to inspect the cell 102, e.g. give a measure of the double layer capacitance CDL of the cell 102; the stimulus voltage provided to the counter electrode CE is given by the lowest significant bit (LSB) of the IDAC 1402. Second, the hysteresis avoids switching at the output of the comparator 1204 every cycle, thereby reducing power consumption. If the comparator 1204 were implemented without hysteresis, the DAC code of the IDAC 1402 would update every clock cycle leading to higher power consumption. Third, hysteresis enables the ability to move the clock edge to a frequency of interest, e.g. to measure the double layer capacitance CDL of the cell 102. Fourth, hysteresis decreases sensitivity to noise.

In a variation of any of the circuits 500, 900, 1000, 1100, 1200, 1700, 1800, the cell 102 may be rearranged such that the working electrode WE and counter electrode CE are swapped. For example, with reference to FIG. 18, the working electrode may be coupled to the output of the DAC 1402 and the non-inverting input of the comparator 1204, and the counter electrode CE may be coupled to the reference voltage (e.g. ground).

As mentioned previously, by reducing the size and power of drive and measurement circuitry, multiple electrochemical sensors can be integrated into a single device, thereby either providing redundancy or enabling the sensing of multiple analytes in a single chip. This may be particularly advantageous in applications such as continuous glucose monitoring, where it may be desirable to measure concentrations of several analytes including but not limited to two or more of glucose, ketones, oxygen, lactate, and the like.

Figures 19, 20:
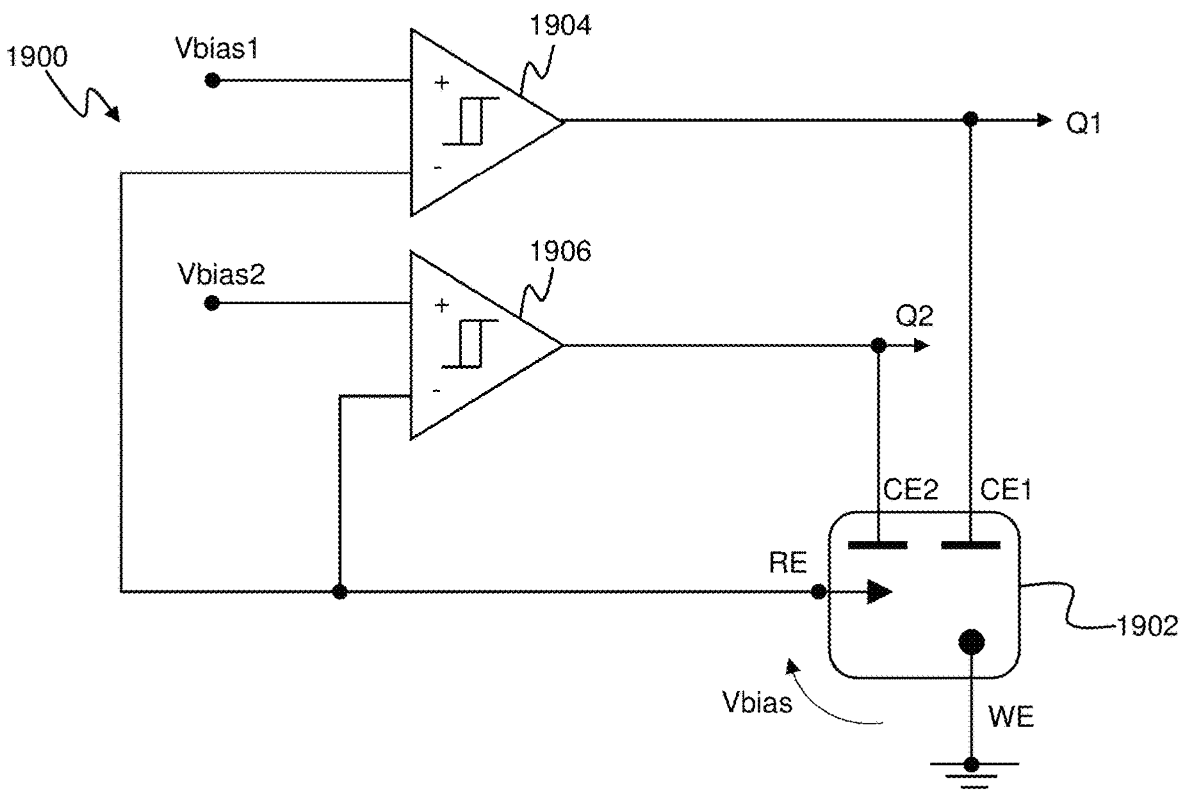
FIGS. 19 to 22 are schematic diagrams of multi-analyte measurement circuits for measuring characteristics of multiple analytes in an electrochemical cell.

FIG. 19 illustrates multi-analyte measurement circuit 1900 configured to measure two analytes. The measurement circuit 1900 comprises an electrochemical cell 1902 comprising first and second counter electrodes CE1, CE2, a common working electrode WE and a common reference electrode RE. The measurement circuit 1900 further comprises a first hysteretic comparator 1904 and a second hysteretic comparator 1906. Each of the first and second hysteretic comparators 1904, 1906 are configured in a similar manner to the comparator 502 of FIG. 5.

A first input of the first hysteretic comparator 1904 is coupled to a first bias voltage VBIAS1. An output of the first hysteretic comparator 1904 is coupled to the first counter electrode CE1 and the reference electrode RE is coupled to a second input of first hysteretic comparator 1904. As such, a feedback loop between the output of the first hysteretic comparator 1904 and the second input via the first counter electrode CE1. Thus, the first hysteretic comparator 1904 is configured to output a first output signal Q1 which is a PWM signal representing a first analyte concentration associated with current flow between the first counter electrode CE1 and the working electrode WE.

A first input of the second hysteretic comparator 1906 is coupled to a second bias voltage VBIAS2. An output of the second hysteretic comparator 1906 is coupled to the second counter electrode CE2 and the reference electrode RE is coupled to a second input of second hysteretic comparator 1906. As such, a feedback loop between the output of the second hysteretic comparator 1906 and the second input via the second counter electrode CE2. Thus, the second hysteretic comparator 1906 is configured to output a second output signal Q1 which is a PWM signal representing a second analyte concentration associated with current flow between the second counter electrode CE2 and the working electrode WE.

Thus, the measurement circuit 1900 is able to measure two different analyte concentrations using a common electrochemical cell 1902 and only two hysteretic comparators 1904, 1906. Whilst the measurement circuit 1900 shown in FIG. 19 is configured to characterise two different analytes, in other embodiments, any number of analytes may be measured by providing an additional counter electrode and hysteretic comparator for each additional analyte to be characterised. An advantage of the circuit 1900 shown in FIG. 19 specific to multiple counter electrode configurations is that the reduced DAC code size leads to less kick on the common impedance (shared between working electrodes), and hence less cross talk between channels.

In the example shown in FIG. 19, the multi-electrode cell 1902 comprises a reference electrode RE. However, in other examples, the reference electrode RE may be omitted. In which case, the non-inverting input of the first comparator 1904 may be coupled to the first counter electrode CE1, and the non-inverting input of the second comparator 1906 may be coupled to the second counter electrode CE2.

It will also be appreciated that the hysteretic comparators 1904, 1906 shown in FIG. 19 may be replaced with any one of the arrangements described above with reference to FIGS. 5 to 18 without departing from the scope of the present disclosure.

FIG. 20 illustrates a multi-analyte circuit 2000 configured to measure two analytes. The circuit 2000 differs from the circuit 1900 shown in FIG. 19 in that the electrochemical cell 1902 has been replaced with an electrochemical cell 2002 comprising first and second working electrode WE1, WE2, a common counter electrode CE, and a common reference electrode RE.

The first input of the first hysteretic comparator 1904 is coupled to the first bias voltage VBIAS1. The output of the first hysteretic comparator 1904 is coupled to the first working electrode WE1 and the reference electrode RE is coupled to the second input of first hysteretic comparator 1904. As such, a feedback loop between the output of the first hysteretic comparator 1904 and the second input via the first working electrode WE1. Thus, the first hysteretic comparator 1904 is configured to output a first output signal Q1 which is a PWM signal representing a first analyte concentration associated with current flow between the first working electrode CE1 and the counter electrode CE.

The first input of the second hysteretic comparator 1906 is coupled to the second bias voltage VBIAS2. The output of the second hysteretic comparator 1906 is coupled to the second working electrode WE2 and the reference electrode RE is coupled to the second input of second hysteretic comparator 1906. As such, a feedback loop between the output of the second hysteretic comparator 1906 and the second input via the second counter electrode CE2. Thus, the second hysteretic comparator 1906 is configured to output a second output signal Q1 which is a PWM signal representing a second analyte concentration associated with current flow between the second working electrode WE2 and the working electrode CE.

Thus, like the measurement circuit 1900, the measurement circuit 2000 is able to measure two different analyte concentrations using a common electrochemical cell 2002 and only two hysteretic comparators 1904, 1906. Whilst the measurement circuit 2000 shown in FIG. 20 is configured to characterise two different analytes, in other embodiments, any number of analytes may be measured by providing an additional working electrode and hysteretic comparator for each additional analyte to be characterised.

It will also be appreciated that the hysteretic comparators 1904, 1906 shown in FIG. 20 may be replaced with any one of the arrangements described above with reference to FIGS. 5 to 18 without departing from the scope of the present disclosure. An advantage of the circuit 20 shown in FIG. 20 specific to multiple working electrode configurations is that the reduced DAC code size leads to less kick on the common impedance (shared between working electrodes), and hence less cross talk between channels.

In the example shown in FIG. 20, the multi-electrode cell 2002 comprises a reference electrode RE. However, in other examples, the reference electrode RE may be omitted. In which case, the non-inverting input of the first comparator 1904 may be coupled to the first working electrode WE1, and the non-inverting input of the second comparator 2906 may be coupled to the second working electrode WE2.

In either of the implementations described with reference to FIGS. 19 and 20 the hysteretic comparators 1904, 1906 may be controlled to ensure that switching of the two comparators never occurs at the same time. In doing so, kick can be minimized, thus reducing non-linear response at the respective cells 1902, 2002. To achieve this, the two feedback loops may be combined and/or controlled together.

Figure 21:
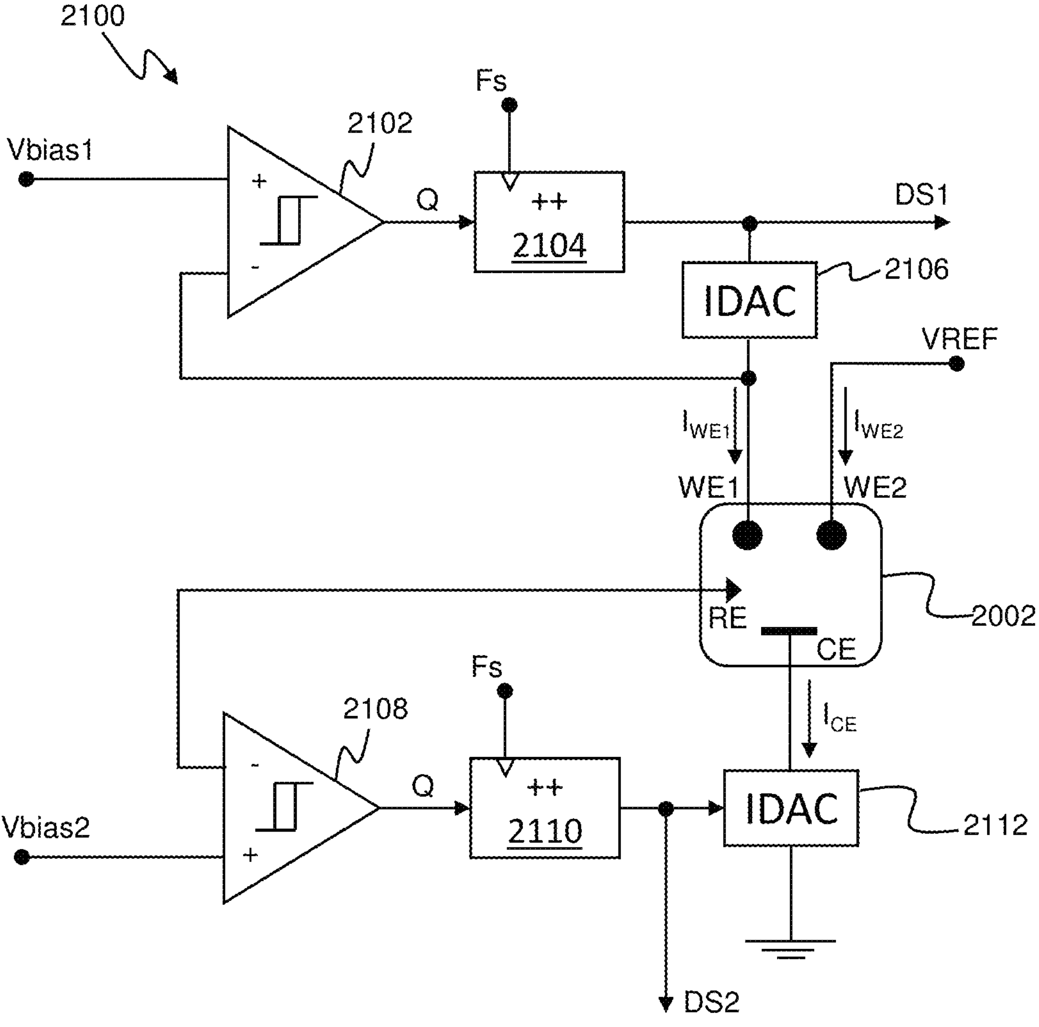

FIG. 21 illustrates a multi-analyte circuit 2100 configured to measure two analytes using the same electrochemical cell 2002 as that shown in FIG. 20. The measurement circuit 2100 comprises a first hysteretic comparator 2102, a first decoder 2104, a first DAC 2106, a second hysteretic comparator 2108, a second decoder 2110 and a second DAC 2112.

The first hysteretic comparator 2102, first decoder 2104, and first DAC 2106 are arranged in a similar manner to the comparator 1204, decoder 1802 and DAC 1402 of the circuit 1800 shown in FIG. 18. The first comparator 2102 comprises a non-inverting input coupled to a first bias voltage Vbias1 and an inverting input coupled to the first working electrode WE1 of the cell 2002. An output of the first comparator 2102 is provided as a digital input to the decoder 2104 which outputs a count value based on the value Q provided at its input. For example, when the output of the hysteretic comparator 2102 is digital '1', the decoder 2104 counts up, and when the output of the hysteretic comparator 2102 is digital '0', the decoder 2104 counts down. The output of the decoder 2104 is output as the first digital output DS1 representing the voltage between the first working electrode WE1 and the reference electrode RE. The output of the decoder 2104 is also provided as an input to the DAC 2106, the output of which is coupled to the first working electrode WE1 and the non-inverting input of the first hysteretic comparator 2102. Thus, the decoder 2104 is configured to regulate the first working electrode current IWE1 to match the feedback voltage provided to the inverting input of the first comparator 2102 with the first bias voltage Vbias1.

The second hysteretic comparator 2108, the second decoder 2110 and the second DAC 2112 are configured in a feedback loop between the reference electrode RE and the counter electrode CE. The second hysteretic comparator 2108 comprises a non-inverting input coupled to the reference electrode RE of the cell 2002, and an inverting input coupled to a second bias voltage Vbias2. An output Q of the second hysteretic comparator 2110 is coupled to an input of the second decoder 2110 which outputs a digital signal DS2 representing the voltage between the reference and counter electrode RE, CE. The digital count signal DS2 is also provided as an input to the current DAC 2112 which controls the current flowing between the counter electrode CE and a reference voltage (in this case ground) in dependence of the digital count signal DS2. Thus, the DAC 2112 controls the counter electrode current ICE such that the voltage at the reference electrode (non-inverting input of the second comparator 2108) matches the second bias voltage Vbias2.

The second working electrode WE2 is coupled to a reference voltage VREF. A second working electrode current IWE2 flows between the second working electrode WE2 and the counter electrode CE.

It will be appreciated that the current ICE flowing at the counter electrode CE is equal to the combination of currents flowing at the first and second working electrodes WE1, WE2, i.e.:

$$I_{CE} = I_{WE1} + I_{WE2}$$

Since the first working electrode current IWE1 can be derived from the first digital count signal DS1 and the counter electrode current ICE can be derived from the second digital count signal DS2, the second working electrode current IWE2 can be derived from the first and second digital count signals DS1, DS2.

In the example shown in FIG. 21, the multi-electrode cell 2002 comprises a reference electrode RE. However, in other examples, the reference electrode RE may be omitted. In which case, the non-inverting input of the first comparator 2004 may be coupled to the counter electrode CE.

Thus, like the measurement circuits 1900, 2000, the measurement circuit 2100 is able to measure two different analyte concentrations using a common electrochemical cell 2002 and only two hysteretic comparators 2102, 2108. Whilst the measurement circuit 2100 shown in FIG. 21 is configured to characterise two different analytes, in other embodiments, any number of analytes may be measured by providing an additional working electrode and hysteretic comparator for each additional analyte to be characterised.

It will also be appreciated that each of the feedback arrangements shown in FIG. 21 may be replaced with any one of the arrangements described above with reference to FIGS. 5 to 20 without departing from the scope of the present disclosure.

In the implementation shown in FIG. 21, the hysteretic comparators 2102, 2108 may be controlled to ensure that switching of the two comparators never occurs at the same time. In doing so, kick can be minimized, thus reducing non-linear response at the cell 2002. To achieve this, the two feedback loops may be combined and/or controlled together.

Figure 22:
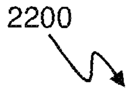
Figure 22:
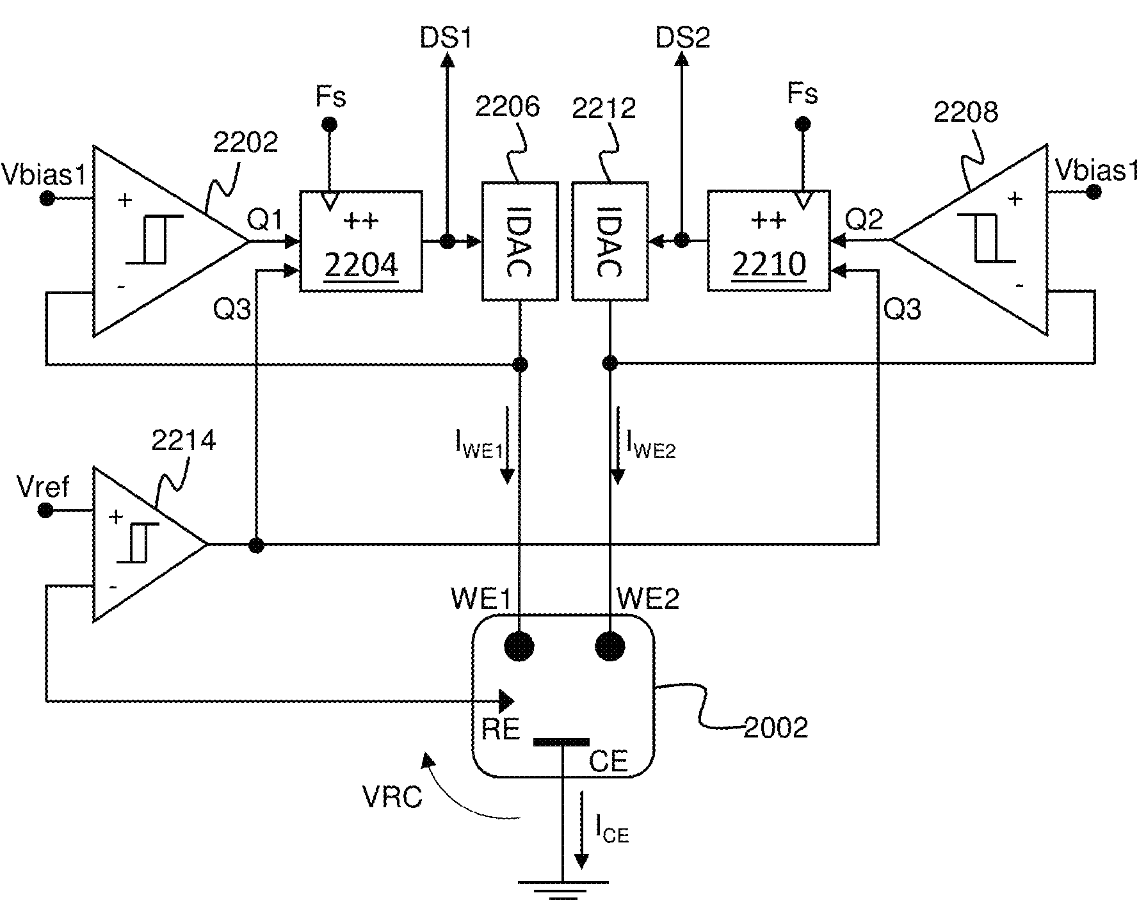

FIG. 22 illustrates another multi-analyte circuit 2200 configured to measure two analytes using the same electrochemical cell 2002 as that shown in FIGS. 20 and 21. The measurement circuit 2200 comprises a first hysteretic comparator 2202, a first decoder 2204, a first DAC 2206, a second hysteretic comparator 2208, a second decoder 2210, a second DAC 2212, and a third hysteretic comparator 2214.

The first comparator 2202 comprises a non-inverting input coupled to a first bias voltage Vbias1, an inverting input coupled to the first working electrode WE1 and an output coupled to a first input of the decoder 2204. The first comparator 2202 is configured to output a first digital signal Q1 based on a comparison of voltage at its inputs.

The first decoder 2204 is configured to receive the digital signal Q1 and a third digital signal Q3 output from the third comparator 2214 and output a digital count signal DS1 based on the first and third digital signals Q1, Q3. For example, if Q1 and Q3 are digital "1", the first decoder 2204 is configured to add two (+2) to the first digital count signal DS1. For example, if Q1 is "1" and Q3 is "0", the first decoder 2204 is configured to add one (+1) to the first digital count signal DS1.

The first digital count signal DS1 is provided to the first DAC 2206 whose output is coupled to the first working electrode WE1 and thus the inverting input of the first comparator 2202. The first DAC 2206 is configured to control the first working electrode current IWE1 flowing at the first working electrode WE1 in dependence on the first digital count signal DS1. Thus, the feedback loop formed from the first comparator 2203, the first decoder 2204 and the first DAC 2206 acts to control the first working electrode current IWE1 to maintain the voltage at the non-inverting input of the first comparator 2202 substantially equal to the first bias voltage Vbias1.

The second comparator 2208 comprises a non-inverting input coupled to the first bias voltage Vbias1, an inverting input coupled to the second working electrode WE2 and an output coupled to a first input of the second decoder 2210. The second comparator 2208 is configured to output a second digital signal Q2 based on a comparison of voltage at its inputs.

The second decoder 2210 is configured to receive the second digital signal Q2 and the third digital signal Q3 output from the third comparator 2214 and output a second digital count signal DS2 based on the second and third digital signals Q2, Q3. For example, if Q2 and Q3 are digital "1", the second decoder 2210 is configured to add two (+2) to the second digital count signal DS2. For example, if Q2 is "1" and Q3 is "0", the second decoder 2210 is configured to add one (+1) to the second digital count signal DS2.

The second digital count signal DS2 is provided to the second DAC 2212 whose output is coupled to the second working electrode WE2 and thus the inverting input of the second comparator 2208. The second DAC 2212 is configured to control the second working electrode current IWE2 flowing at the second working electrode WE2 in dependence on the second digital count signal DS2. Thus, the feedback loop formed from the second comparator 2208, the second decoder 2210 and the second DAC 2212 acts to control the second working electrode current IWE2 to maintain the voltage at the non-inverting input of the second comparator 2208 substantially equal to the first bias voltage Vbias1.

The third comparator 2214 comprises a non-inverting input coupled to a reference voltage VREF, an inverting input coupled to the reference electrode RE and the output discussed above as being coupled to a second input of each of the first and second decoders 2204, 2210.

Thus, using the third comparator 2214 in combination with the first and second comparators 2202, 2208, voltage VRC between the reference and counter electrodes REC, CE can be regulated. Specifically, a change in the output Q3 of the third comparator 2214 leads to a change in both the first and second working electrode currents IWE1, IWE2 which in turn leads to a change in the voltage VRC between reference and counter electrodes RE, CE. Thus, the voltage VRC can be adjusted by adjusting the reference voltage VREF at the non-inverting input of the third comparator 2214. With knowledge of the voltage VRC and the first and second working electrode current IWE1, IWE2 (from the first and second digital output signals DS1, DS2), the voltage between each of the working electrode WE1, WE2 and the reference electrode RE can be obtained.

Whilst the measurement circuit 2200 shown in FIG. 22 is configured to characterise two different analytes, in other embodiments, any number of analytes may be measured by providing an additional working electrode, comparator, decoder and DAC for each additional analyte to be characterised, the output of the third comparator 2214 being provided as an additional input to each additional decoder.

It will also be appreciated that each of the feedback arrangements shown in FIG. 22 may be replaced with any one of the arrangements described above with reference to FIGS. 5 to 20 without departing from the scope of the present disclosure.

In the implementation shown in FIG. 21, the hysteretic comparators 2202, 2208 may be controlled to ensure that switching of the two comparators never occurs at the same time. In doing so, kick can be minimized, thus reducing non-linear response at the cell 2002. To achieve this, the two feedback loops may be combined and/or controlled together.

Any of the decoders described above may be implemented as an UP/DOWN counter, counting up upon receipt of a digital "1" and down upon receipt of a digital "0". Such a counter may be regarded as a first-order integrator. Alternatively, each of the decoders may be implemented using any other type of integrator, such as a cascaded integratory, higher-order structure, or digital loop filter.

The comparators described in the above embodiments are generally operated in a hysteretic mode. Operating comparators in this mode enables substantial power savings since their outputs can easily be decoded using low-power signal processing techniques for measuring the duty cycle of the output waveform. However, this comes at a cost of adding noise in the form of a PWM tone. In some situations, it may be advantageous to suppress PWM tone so as to improve the accuracy and/or quality of measurements of characteristics of an electrochemical cell. To do so, in some embodiments, the comparators described herein may be switchable from a (low-power) hysteretic mode to a (higher power) Sigma-Delta mode where the comparator does not implement hysteresis. In doing so, the decode becomes more time and/or processor intensive since the output is equivalent to a one-bit sequency running at the frequency at which the comparator is latched. However, any PWM tone will be suppressed thereby improving the performance of any measurement circuit in which the switchable comparator is implemented.

In the embodiments described above, a DC current is applied at the counter electrode CE of the various electrochemical cells illustrated. In some instances, however, it may be advantageous to apply an alternating current (AC) to the counter electrode CE of any of the electrochemical cells in order to illuminate or excite a electrochemical cell at a given frequency. Referring for simplicity to FIG. 5, one way to apply AC to the counter electrode CE in the electrochemical cell 500 is to vary the limit cycle of the hysteretic comparator 502. This may be achieved by controlling the amount of hysteresis applied by the hysteretic comparator 502.

As noted previously, the output Q of the hysteretic comparator 502 will change state when the feedback signal SFB reaches the relevant threshold, e.g. exceeding +H or dropping below-H and will remain in that state until the other threshold is reached. The time that the signal remains in one state, i.e. duration $\alpha$ or $\beta$, will thus depend on how long it takes for feedback signal to change by the amount 2H. This will depend on the bias signal VBIAS and hence the difference between the input signal SIN and the feedback signal SFB but will also clearly depend on the threshold values and the amount of hysteresis applied.

In some embodiments, the amount of hysteresis applied by the comparator 502 may be controlled. There are many ways the hysteresis applied by a hysteretic comparator may be varied as will be understood by one skilled in the art.

The hysteresis applied by the comparator 502 may be controlled so as to control the cycle period (and cycle frequency). To do so, the output cycle period of the output signal Q may be monitored and used to adjust the hysteresis applied. For example, the count value $\alpha+\beta$ which is produced or derived from a decoder (such as the decoder 800 of FIG. 8) could be used to determine the current cycle period (or frequency) of the output signal Q.

The limit cycle period/frequency may thus be controlled so as to apply a time-varying current to the counter electrode CE at a predetermined frequency. The limit cycle may be varied either by adjusting the bias voltage VBIAS, or if a delay element is provided in the feedback path (such as the delay element 1002 shown in FIG. 10), by varying the delay of the delay element.

Controlling of the hysteresis applied also allows the cycle period of the output signal Q to be controlled to remain substantially constant on a cycle-by-cycle basis. Additionally, or alternatively, the hysteresis control could be used to enable operation in different modes, for instance to provide a trade-off between performance and power consumption. For example the limit cycle frequency of the time-encoded signal could be reduced to save power under certain conditions, for example when fewer samples of analyte concentration are required. When it is determined that more samples are required over a shorter period, the limit cycle could be increased. Adaptive hysteretic control is described in more detail in U.S. Pat. No. 10,256,837, the contents of which is incorporated by reference in its entirety.

In some embodiments, characteristics of the loop filter (e.g. the electrochemical cell 102) may be inferred from known variable(s) and measured parameter(s). Referring as an example to FIG. 5, the hysteresis applied by the comparator 502 may be known and the limit cycle of output signal Q may be measured. Since the impedance of the loop filter comprising the cell 102 is proportional to the hysteresis and the limit cycle, the overall impedance of the system may be determined. If the loop filter comprises N circuit elements (for example), then by measuring the limit cycle each of at N different values of hysteresis (implemented by the comparator), then N equations may be derived and solved to fully define the parameters of each of the N elements of the loop filter. In some embodiments, the relationship between the hysteresis and limit cycles may be defined in a lookup table which may in turn be used to determine one or more characteristics of the cell 102. It will be appreciated that this technique may be implemented with respect to any of the measurement circuits described in the present disclosure.

Embodiments of the present disclosure may also implement chopping or auto-zero techniques to reduce or substantially eliminate sensitivity to DC offset. Referring to FIG. 5 as an example, the polarity of the comparator 502 may be inverted on every other cycle so as to convert any DC offset associated with the loop filter (e.g. the cell 102) into a variable DC output voltage (e.g. a square wave at a chopping frequency). This square wave present in the output signal Q can easily be filtered out by downstream filters (not shown) resulting in a filtered output signal which is free from the effects of DC offset. Preferably, chopping is synchronised with the limit cycle of the comparator 502. For example, the polarity of the comparator 502 may be inverted during a falling edge of the output Q or during a rising edge of the output Q. It will be appreciated that the falling edge of the output signal Q is the edge which varies in time to adjust the limit cycle of the comparator 502 whereas the rising edge is substantially periodic (i.e. the frequency of the rising edge is constant). As such, advantageously, chopping is synchronised with the falling edge of the output signal Q such that the chopping frequency is spread over a range of frequencies (coinciding with the falling edge of the output Q). It will be appreciated that this technique may be implemented with respect to any of the measurement circuits described in the present disclosure.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general-purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

It should be noted that the above-mentioned embodiments illustrate rather than limit the invention, and that those skilled in the art will be able to design many alternative embodiments without departing from the scope of the appended claims. The word “comprising” does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for measuring a characteristic of an electrochemical cell, the circuitry comprising:
- a comparator having a first comparator input, a second comparator input and a comparator output;
- a feedback path between the comparator output and the second comparator input configured to provide a feedback signal to the second comparator input;
- an integrator in the feedback path, the integrator comprising a data input coupled to the comparator output and an integrator output; and
- a loop filter configured to apply filtering to the feedback path to generate the feedback signal, wherein the loop filter comprises the electrochemical cell.

2. Circuitry of claim 1, wherein the comparator is a hysteretic comparator.

3. Circuitry of claim 1, wherein the integrator output is coupled to the electrochemical cell via a first impedance.

4. Circuitry of claim 3, wherein the electrochemical cell comprises at least one working electrode and a counter electrode, wherein the integrator output is coupled to the working electrode via the first impedance.

5. Circuitry of claim 4, wherein the working electrode is coupled to the second comparator input.

6. Circuitry of claim 4, wherein the electrochemical cell comprise a reference electrode coupled to the second comparator input.

7. Circuitry of claim 3, wherein the first impedance is provided by a digital to analog converter (DAC).

8. Circuitry of claim 7, wherein the DAC is provided in series between an output of the integrator and the counter electrode.

9. Circuitry of claim 7, wherein the DAC comprises a current DAC or a finite impulse response digital to analog converter (FIR DAC).

10. Circuitry of claim 4, wherein the at least one working electrode is coupled to a variable reference voltage.

11. Circuitry of claim 4, further comprising:
- one or more additional working electrodes;
- an additional comparator for each of the one or more additional working electrodes, each additional comparator comprising an additional first comparator input, an additional second comparator input and an additional comparator output;
- an additional feedback path between each additional comparator output and each additional second comparator input configured to provide an additional feedback signal to a respective additional second comparator input, wherein each additional comparator output is coupled to a respective additional working electrode;
- an additional integrator in each additional feedback path, the additional integrator comprising an additional data input coupled to the additional comparator output and an additional integrator output.

12. Circuitry of claim 11, further comprising:
- an auxiliary comparator comprising an auxiliary first input coupled to a reference voltage, an auxiliary second input coupled to a reference electrode of the electrochemical cell, and an output coupled to a second data input of the integrator and each additional integrator.

13. Circuitry of claim 11, wherein the comparator and each additional comparator are hysteretic, and wherein hysteretic switching of the comparator and each additional comparator is controlled to minimise interference between the comparator output and each additional comparator output.

14. Circuitry of claim 1, further comprising a voltage-controlled oscillator arranged between the comparator output and the data input.

15. Circuitry of claim 1, comprising bias circuitry for applying a bias voltage to the first comparator input.

16. Circuitry of claim 15, wherein the bias circuitry comprises a filter configured to receive an input voltage and generate the bias voltage.

17. Circuitry of claim 16, wherein the filter comprises an integrator having a first integrator input for receiving the input voltage, a second integrator input and an integrator output, wherein the integrator output is coupled to the first comparator input and to the first integrator input via a first capacitance, and wherein the second integrator input is coupled to the second comparator input.

18. Circuitry of claim 16, wherein the bias voltage is controlled to vary a limit cycle frequency of the comparator.

19. Circuitry of claim 1, wherein the integrator comprises a counter.

20. Circuitry of claim 1, further comprising hold circuitry configured to hold an electrode of the electrochemical cell at a predetermined voltage.

21. Circuitry of claim 20, wherein the hold circuitry is further configured to power down the comparator when the electrode of the electrochemical cell is held at the predetermined voltage.

22. Circuitry of claim 1, wherein a polarity of the comparator is inverted on every other switching cycle of the comparator.

23. Circuitry of claim 22, wherein inversion of the polarity of the comparator is synchronised with a rising edge or a falling edge of an output signal at the comparator output.

24. Circuitry for measuring first and second characteristics of an electrochemical cell comprising a first working electrode, a second working electrode and a counter electrode, the circuitry comprising:

a first comparator having a first comparator input, a second comparator input and a first comparator output;

a first feedback path between the first comparator output and the second comparator input configured to provide a first feedback signal to the second comparator input;

a first loop filter configured to apply filtering to the first feedback path to generate the first feedback signal, wherein the loop filter comprises the electrochemical cell;

a second comparator having a third comparator input, a fourth comparator input and a second comparator output;

a second feedback path between the second comparator output and the fourth comparator input configured to provide a second feedback signal to the fourth comparator input; and a second loop filter configured to apply filtering to the second feedback path to generate the first feedback signal, wherein the second loop filter comprises the electrochemical cell.

25. Circuitry of claim 24, wherein:

the first loop filter comprises the first working electrode;

the second feedback path is via the counter electrode; and the second working electrode is coupled to a fixed reference voltage.

26. Circuitry of claim 24, wherein the fourth comparator input is coupled to the counter electrode.

27. Circuitry of claim 24, wherein the fourth comparator input is coupled to a reference electrode of the electrochemical cell.

28. An electronic device comprising the circuitry of claim 1, wherein the device comprises one of a continuous glucose monitor, a mobile computing device, a laptop computer, a tablet computer, a games console, a remote control device, a home automation controller or a domestic appliance, a toy, a robot, an audio player, a video player, or a mobile telephone, and a smartphone.

* * * * *